United States Patent
Zinevich

(10) Patent No.: US 9,882,663 B2
(45) Date of Patent: Jan. 30, 2018

(54) DOPPLER LOCATION OF SIGNAL LEAKS IN AN HFC NETWORK

(71) Applicant: ARCOM DIGITAL, LLC, Syracuse, NY (US)

(72) Inventor: Victor M. Zinevich, Voronezh (RU)

(73) Assignee: ARCOM DIGITAL, LLC, Syracuse, NY (US)

( * ) Notice: Subject to any disclaimer, the term of this patent is extended or adjusted under 35 U.S.C. 154(b) by 0 days.

(21) Appl. No.: 15/073,112

(22) Filed: Mar. 17, 2016

(65) Prior Publication Data

US 2017/0272184 A1    Sep. 21, 2017

(51) Int. Cl.
*H04B 1/00* (2006.01)
*H04B 17/345* (2015.01)
(Continued)

(52) U.S. Cl.
CPC .......... *H04B 17/345* (2015.01); *G01S 3/8022* (2013.01); *G01S 5/021* (2013.01);
(Continued)

(58) Field of Classification Search
CPC .. H04N 7/181; H04N 21/214; H04N 21/2181; H04N 21/2225; H04N 21/2265;
(Continued)

(56) References Cited

U.S. PATENT DOCUMENTS 4,072,899 A    2/1978 Shimp
4,276,509 A    6/1981 Bryant et al.
(Continued)

FOREIGN PATENT DOCUMENTS

WO    WO0013424 A1    3/2000
WO    WO2013003301 A1    1/2013
(Continued)

OTHER PUBLICATIONS

European Patent Office, International Search Report on PCT Application No. PCT/US2015/064222 (Pub. No. WO2016/111786 (Jul. 14, 2016)), entitled Detecting Leakage of OFDM Signals from an HFC Network, date of ISR Mar. 15, 2016, pp. 1-4, published by World Intellectual Property Organization (WIPO), Geneva, Switzerland. Also, see copending U.S. Appl. No. 14/936,551, filed Nov. 9, 2015 (Published US 2016/0197804).
(Continued)

*Primary Examiner* — Ajibola Akinyemi
(74) *Attorney, Agent, or Firm* — Lawrence P. Trapani, Esq.

(57) ABSTRACT

The invention involves using Doppler shift to locate a leak of a signal from an HFC network. The leaked signal includes a component having a nominal frequency. The invention comprises: (a) moving along a drive route in the area of the network; (b) recording a speed at a number of drive-route points along the drive route; (c) at each point, receiving the component at a received frequency; (d) for each point, measuring the received frequency; (e) for each point, determining a measured Doppler shift from a difference between the received and nominal frequencies; (f) estimating a zero Doppler shift and a zero Doppler shift point based on the measured Doppler shifts; and (g) estimating the leak location based on the estimated zero Doppler shift point.

39 Claims, 18 Drawing Sheets

(51) Int. Cl.
*G01S 5/02* (2010.01)
*G01S 3/802* (2006.01)
*G01S 11/10* (2006.01)
G01S 5/06 (2006.01)
G01R 31/08 (2006.01)
H04B 7/01 (2006.01)

(52) U.S. Cl.
CPC .............. *G01S 11/10* (2013.01); *G01R 31/08* (2013.01); *G01S 5/02* (2013.01); *G01S 5/06* (2013.01); *H04B 7/01* (2013.01)

(58) Field of Classification Search
CPC ........... H04N 21/2383; H04N 21/2393; H04N 21/25816; H04N 21/25841; H04N 21/41422; H04N 21/43615; H04N 21/43637; H04N 21/4382
USPC ........................................................ 455/63.1
See application file for complete search history.

(56) References Cited

U.S. PATENT DOCUMENTS

| | | | |
|---|---|---|---|
| 5,294,937 | A | 3/1994 | Ostteen et al. |
| 5,777,662 | A | 7/1998 | Zimmerman |
| 6,005,518 | A | 12/1999 | Kallina |
| 6,018,358 | A | 1/2000 | Bush |
| 6,600,515 | B2 | 7/2003 | Bowyer et al. |
| 6,801,162 | B1 | 10/2004 | Eckenroth et al. |
| 6,804,826 | B1 | 10/2004 | Bush et al. |
| 6,833,859 | B1 | 12/2004 | Schneider et al. |
| 6,867,596 | B1 | 3/2005 | Mizuno |
| 7,250,772 | B2 | 7/2007 | Furse et al. |
| 7,360,124 | B2 | 4/2008 | Bouchard |
| 7,415,367 | B2 | 8/2008 | Williams |
| 7,548,201 | B2 | 6/2009 | Eckenroth et al. |
| 7,664,187 | B2 | 2/2010 | Chen et al. |
| 7,788,050 | B2 | 8/2010 | Williams |
| 7,945,939 | B2 | 5/2011 | Eckenroth et al. |
| 8,233,862 | B2 | 7/2012 | Gaddam et al. |
| 8,456,530 | B2 | 6/2013 | Zinevich |
| 8,605,806 | B2 | 12/2013 | Krishnan et al. |
| 8,650,605 | B2 | 2/2014 | Zinevich |
| 8,749,248 | B2 | 6/2014 | Murphy et al. |
| 8,856,850 | B2 | 10/2014 | Sala et al. |
| 8,867,561 | B2 | 10/2014 | Urban et al. |
| 8,904,460 | B2 | 12/2014 | Zinevich |
| 9,021,539 | B2 | 4/2015 | Stelle, IV |
| 9,106,886 | B2 | 8/2015 | Bush et al. |
| 9,112,762 | B2 | 8/2015 | Murphy |
| 9,160,407 | B2 | 10/2015 | Stelle, IV |
| 9,167,460 | B2 | 10/2015 | Bernard et al. |
| 9,374,291 | B2 | 6/2016 | Murphy |
| 9,455,766 | B2 | 9/2016 | Williams et al. |
| 2002/0101918 | A1 | 8/2002 | Rodman et al. |
| 2005/0034170 | A1 | 2/2005 | Bush et al. |
| 2006/0094943 | A1 | 5/2006 | Van Slyke |
| 2007/0022457 | A1 | 1/2007 | Eckenroth et al. |
| 2008/0133308 | A1 | 6/2008 | Harris |
| 2008/0220723 | A1 | 9/2008 | Krishnamoorthi et al. |
| 2009/0316634 | A1 | 12/2009 | Sahara |
| 2011/0043640 | A1 | 2/2011 | Zinevich |
| 2011/0267474 | A1 | 11/2011 | Sala et al. |
| 2012/0042213 | A1 | 2/2012 | Zimmerman |
| 2012/0086865 | A1 | 4/2012 | Bush et al. |
| 2012/0116697 | A1 | 5/2012 | Stelle, IV et al. |
| 2012/0257661 | A1 | 10/2012 | Murphy et al. |
| 2013/0229310 | A1 | 9/2013 | Parks et al. |
| 2013/0291044 | A1* | 10/2013 | Zinevich .......... H04N 21/44209 725/111 |
| 2013/0322569 | A1 | 12/2013 | Murphy et al. |
| 2014/0036975 | A1 | 2/2014 | Wolcott et al. |
| 2014/0105251 | A1 | 4/2014 | Bouchard |
| 2014/0146864 | A1 | 5/2014 | Stelle, IV et al. |
| 2014/0254407 | A1 | 9/2014 | Williams |
| 2014/0294052 | A1 | 10/2014 | Currivan et al. |
| 2015/0003226 | A1 | 1/2015 | Bernard et al. |
| 2015/0341810 | A1 | 11/2015 | Murphy |
| 2015/0381468 | A1 | 12/2015 | Murphy |
| 2016/0036492 | A1 | 2/2016 | Williams et al. |
| 2016/0112734 | A1 | 4/2016 | Williams et al. |
| 2016/0197804 | A1* | 7/2016 | Zinevich ................. H04L 43/08 370/252 |
| 2017/0019148 | A1 | 1/2017 | Williams |

FOREIGN PATENT DOCUMENTS

| | | |
|---|---|---|
| WO | WO2016126943 A1 | 8/2016 |
| WO | WO2017192206 A2 | 11/2017 |

OTHER PUBLICATIONS

European Patent Office, Written Opinion of International Searching Authority, on PCT Application No. PCT/US2015/064222 (Pub. No. WO2016/111786 (Jul. 14, 2016)), entitled Detecting Leakage of OFDM Signals from an HFC Network, date of Written Opinion Mar. 15, 2016, pp. 1-5, published by World Intellectual Property Organization (WIPO), Geneva, Switzerland. See copending U.S. Appl. No. 14/936,551, filed Nov. 9, 2015.

European Patent Office, International Search Report on PCT Application No. PCT/US2015/050568 (Pub. No. WO2016/044518 (Mar. 24, 2016)), entitled Detecting Leakage of OFDM Signals from an HFC Network, date of ISR Jan. 8, 2016, pp. 1-4, published by World Intellectual Property Organization (WIPO), Geneva, Switzerland. Also, see copending U.S. Appl. No. 14/855,643, filed Sep. 16, 2015 (Published US 2016/0087742).

European Patent Office, Written Opinion of International Searching Authority, on PCT Application No. PCT/US2015/050568, Pub. No. WO2016/044518 (Mar. 24, 2016), entitled Detecting Leakage of OFDM Signals from an HFC Network, date of Written Opinion Jan. 8, 2016, pp. 1-8, published by World Intellectual Property Organization (WIPO), Geneva, Switzerland. See copending U.S. Appl. No. 14/855,643, filed Sep. 16, 2015.

ARCOM Digital, LLC, QAM Snare® Technology, How it Works, ARCOM Digital White Paper, May 2016, pp. 1-5, Arcom Digital, LLC, Syracuse, NY.

Rohde & Schwarz, R&S® CLGD DOCSIS Cable Load Generator, Multichannel Signal Generator for DOCSIS 3.1 Downstream and Upstream, Jul. 2015, pp. 2-7, Rohde & Schwarz GmbH & Co., KG, Munich, Germany.

CableLabs®, Data-Over-Cable Service Interface Specifications DOCSIS® 3.1, Physical Layer Specification, CM-SP-PHYv3.1-I03-140610, Oct. 23, 2013 & Jun. 10, 2014, pp. 116-119, 134, 143-145, 158-162, 166-169, & 182-186 (Secs. 7.5.13.2 & 7.5.15.2; & Figs. 7-55, 7-56 & 7-77), Rev.103, CableLabs®, Louisville, CO.

CableLabs®, Remote DOCSIS Timing Interface, Data-Over-Cable Service Interface Specifications DCA—MHAv2, CM-SP-R-DTI-101-150615, Jun. 15, 2015, p. 36, CableLabs®, Louisville, CO.

Shi, Zhenguo, et al., Improved Spectrum Sensing for OFDM Cognitive Radio in the Presence of Timing Offset, EURASIP Journal on Wireless Communications and Networking, Dec. 19, 2014, pp. 1-9, 2014:224, Springer, Germany/London.

Tripathi, Monika, Study of Spectrum Sensing Techniques for OFDM-Based Cognitive Radio, Recent Trends in Electronics & Communication Systems, Jan. 1, 2014, pp. 25-31 (pp. 28 & 30), vol. 1, Issue I, STM Journals, India.

Lu, Lu, et al., Ten Years of Research in Spectrum Sensing and Sharing in Cognitive Radio, EURASIP Journal on Wireless Communications and Networking, Jan. 31, 2012, pp. 1-16, 2012:28, Springer, Germany/London.

Agilent Technologies, Flexible OFDM Signal Generation, Analysis and Troubleshooting, Aerospace and Defense Symposium 2011, Apr. 13, 2011, pp. 1-70 (pp. 44-65), Agilent Technologies, Santa Clara, CA; http://www.ceysight.com/upload/cmc_upload/A11/2_Flexible_OFDM_Signal_Generation_Analysis_and_Troubleshooting.pdf?cmpid=1-3660333773&cc=US&Ic=eng.

(56) References Cited

OTHER PUBLICATIONS

Bokharaiee, Simin et al., Blind Spectrum Sensing for OFDM-Based Cognitive Radio Systems, IEEE Transactions on Vehicular Technology, Mar. 2011, pp. 858-871, vol. 60, No. 3, New York, NY.

Akyildiz, Ian F., et al., Cooperative Spectrum Sensing in Cognitive Radio Networks: A Survey, Physical Communication, Dec. 19, 2010, pp. 40-62 (pp. 40-43 & 46), vol. 4, Issue 1, Mar. 2011, Elsevier, BV, Amsterdam, Netherlands.

Yucek, Tevfik et al., A Survey of Spectrum Sensing Algorithms for Cognitive Radio Applications, IEEE Communications Surveys & Tutorials, Jan. 1, 2009, pp. 116-130, vol. 11, No. 1, First Quarter 2009, New York, NY.

Rembovsky, Anatoly, et al., Radio Monitoring, Problems, Methods, and Equipment, Springer Science + Business Media, LLC, NY, NY, 2009, Chapter 8 (pp. 237-316), and as to Doppler see pp. 240 & 270-272. (http://www.springer.com /la/book/9780387980997).

Gajewski, Piotr et al., Mobile Location Method of Radio Wave Emission Sources, PIERS Online, vol. 5, No. 5, Aug. 2009, pp. 476-480, Military University of Technology, Poland (www.researchgate.net/publications/241687451_mobile_location_method_of_radio_wave_emission_sources).

argos-system.org, Argos User's Manual, Section 3.2, Jan. 1, 2007, pp. 1-4 http://www.argos-system.org/manual/3-location/32_principle.htm.

Liaubet, Roland et al., Argos Location Calculation, Argos Animal Tracking Symposium—Annapolis, MD, Mar. 24-26, 2003, pp. 1-38, (noaasis.noaa.gov/ARGOS/docs/AATS-location.ppt).

King, J.V., Overview of the Cospas-Sarsat Satellite System for Search and Rescue, Communications Research Centre, Ottawa, ON, Canada, Jan. 9, 2002, pp. 1-6, Online Journal of Space Communication (http://spacejournal.ohio.edu/pdf/king.pdf).

U.S. Appl. No. 62/146,848, filed Apr. 13, 2015, entitled Signal Leakage Detection Using Synthetic Phased Arrays, Inventors Thomas Williams, Colin Justis, David Hunter, & Luis Alberto Campos; pp. 4-32 of PDF document (including Figures therein), priority of which is claimed in US 2016/0036492 and US 2017/0019148.

U.S. Appl. No. 62/054,529, filed Sep. 24, 2014, entitled Various Communication Systems and Methods, Inventors Thomas H. Williams, Luis Alberto Campos, & Belal Hamzeh; pp. 4-35 of PDF document (including Figures therein), priority of which is claimed in US 2016/0036492 and US 2017/0019148.

U.S. Appl. No. 62/030,345, filed Jul. 29, 2014, entitled Locating/Identifying Cable Plant Issues, Inventors David Hunter, Tom Williams, Luis Alberto Campos, & Belal Hamzeh; pp. 4-14 of PDF document (including Figures therein), priority of which is claimed in US 2016/0036492 and US 2017/0019148.

Cable Television Laboratories, Inc. (CableLabs®) & JUSTIS, Colin, Transcript of CableLabs® / Colin Justis Video Presentation (video accessible at: owncloud.cablelabs.com/public.php?service=files&t=bf6836ec6103a4669dea504196af4f0f), Feb. 2016, pp. 1-20, CableLabs®, Louisville, CO.

European Patent Office, as Int'l. Searching Authority, in PCT App. PCT/US2017/021820 (published WO2017192206—see above), Counterpart to instant U.S. Appl. No. 15/073,112; Int'l. Search Report Search, Search Strategy & Written Opinion of Int'l. Searching Auth., dated Nov. 3, 2017, pp. 1-12 (PCT claims 1-3 & 9-14 not considered to have satisfied inventive Step); WIPO, Geneva, Switzerland (Rcd by Attorny of Record Herein on Nov. 13, 2017.

* cited by examiner

Predefined Continuous Pilot Subcarrier Spectrums

DOPPLER LOCATION OF SIGNAL LEAKS IN AN HFC NETWORK

CROSS-REFERENCE TO RELATED APPLICATIONS

This application is related to co-pending application Ser. No. 14/855,643, filed Sep. 16, 2015, and co-pending application Ser. No. 14/936,551, filed Nov. 9, 2015, both of which are incorporated herein by reference.

BACKGROUND OF THE INVENTION

Field of Invention

The present invention relates generally to detection and location of impairments in Hybrid Fiber-Coax (HFC) networks, and more particularly to methods and systems for detecting leakage of signals from an HFC network and locating the sources of the leakage in the network.

Background Art

The task of detecting and locating signal leakage from a coaxial cable part of an HFC network is important for preventing such signal leakage ("egress") from interfering with aeronautical and Long Term Evolution (LTE) wireless communication systems. Also, the repair of signal leaks will prevent over-the-air signals from entering and interfering with the HFC network ("ingress"). Leakage detection and location in a modern HFC network (e.g., using a CCAP architecture) presents challenges. First, migration to digital signals, such as QAM signals, has required new leakage/signal detection schemes. A QAM signal looks like noise, thus making it difficult to detect using traditional, narrowband analog leakage detectors. Another type of digital signal, introduced under the Data-Over-Cable Service Interface Specifications (DOCSIS) 3.1 specification (published by Cable Television Laboratories, Inc., Louisville, Colo.), is a wideband (up to 192 MHz) OFDM signal. The OFDM signal has a substantial noise-like component, but is not a simple haystack-shaped spectrum like a QAM signal. Thus, detection of an OFDM signal (e.g., by a sensitive spectrum analyzer) can be more complicated than detection of a QAM signal.

Another challenge in modern HFC networks concerns the proposed CCAP architecture. In a CCAP architecture, there are a number of narrowcast channels (SDV, VOD, DOCSIS, etc.) in the RF downstream spectrum. Each narrowcast channel is formed at a Cable Modem Termination System (CMTS) card and serves only a group of nodes or even a single node. There are a number of CMTS cards, each serving a different node or group of nodes and each potentially containing a different arrangement of narrowcast channels. Thus, leakage detection equipment must have information about all narrowcast channels from the different CMTS's to effectively detect and locate leakage over the entire HFC network.

One method of detecting leakage of digital signals involves injecting into the HFC network a predefined pilot or test signal modulated with specific information (i.e., "tag signal"). This method has been used for many years for detecting analog leakage signals. For example, see the following patents: U.S. Pat. No. 4,072,899 to Shimp; U.S. Pat. No. 6,018,358 to Bush; U.S. Pat. No. 6,600,515 to Bowyer et al.; and U.S. Pat. No. 6,804,826 to Bush et al. This method has also been used for digital leakage detection where an unoccupied channel or gap in the downstream spectrum is allocated for the tag or pilot (preferably near a digital channel). Examples of injecting a CW pilot or pilots among QAM signals (i.e., between QAM channels) are disclosed in: U.S. Pub. Patent App. No. 2011/0267474 (Nov. 3, 2011); PCT Pub. App. WO2013003301 (Jan. 3, 2013); U.S. Pub. Patent App. 2014/0105251 (Apr. 17, 2014); and U.S. Pat. No. 8,749,248 (Jun. 10, 2014). A disadvantage of this method is that extra signals must be injected into the network. Thus, there is a risk that the pilot signals will interfere with network signals. In the case of OFDM signals, the injection of additional pilots may impact data transmission efficiency. Also, in a CCAP architecture, the injection of pilot signals at each RF port of all CMTS cards is not a trivial task and may not even be possible. It may be especially complex or impossible in Fiber Deep systems proposed by Aurora Networks, Santa Clara, Calif. (www.aurora.com).

Another method of detecting digital leakage is based on a coherent cross-correlation method described in U.S. Pat. Nos. 8,456,530 and 8,904,460, issued to the Inventor herein. A commercial embodiment of such a method is supplied by ARCOM DIGITAL, LLC, Syracuse, N.Y., under the brand name QAM Snare®. This method is based on the steps of: (1) sampling the downstream digital signals under synchronization of a stable GPS clock; (2) transmitting those samples to a leakage detector in the field via wireless IP network; and (3) coherently cross-correlating those samples with samples of a received over-the-air leakage signal. The leakage signal is detected (under noisy conditions) from a cross-correlation peak resulting from the cross-correlation. An advantage of this method is that there is no need to inject a tag or pilot signal into the HFC network. Also, this method works with any noise-like digital signal, such as a QAM or OFDM signal. Further, this method allows one to measure the time delay of the QAM or OFDM signal (e.g., from headend to leakage detector) and use that delay to determine a location of the leak. A potential limitation of this method is that equipment for sampling the downstream signal must be installed at the headend (or other reference point in the network). Also, the method is most suited for detecting leakage of broadcast channel signals. As mentioned, the trend in modern networks is to reduce broadcast channels in favor of narrowcast channels. The use of narrowcast channels would require a number of signal sampling systems (including a wireless network capability) at the CMTS cards, which is a complex and costly requirement. Further, a continuous wireless connection between the CMTS cards and the leakage detector may be required (for transmission of downstream signal samples). This requirement is a problem in areas where wireless communication is unreliable. Since narrowcast channels are likely to displace broadcast channels in HFC networks, there is a need for another leakage detection and location solution.

A non-coherent cross-correlation method for detecting leakage of a QAM signal has been proposed in U.S. Pub. Patent App. 2013/0322569 (Dec. 5, 2013). A QAM signal is detected by detecting a spectral component of the received QAM signal, where the spectral component corresponds to a known QAM symbol rate used in the HFC network under test.

Systems for detecting OFDM signals exists in "Cognitive radio" and "Spectrum sensing" wireless communication systems. See for example: Shi et al., Improved Spectrum Sensing for OFDM Cognitive Radio in the Presence of Timing Offset, pp. 1-9, 19 Dec. 2014, EURASIP Journal on Wireless Communications and Networking, Vol. 2014, Issue 224; Tripathi, Study of Spectrum Sensing Techniques for OFDM Based Cognitive Radio, pp. 4-8, August 2014, International Journal of Technology Enhancements and Emerging Engineering Research, Vol. 2, Issue 8; Lu et al., Ten Years of Research in Spectrum Sensing and Sharing in Cognitive Radio, pp. 1-16, 31 Jan. 2012, EURASIP Journal on Wireless Communications and Networking, Vol. 2012, Issue 28; Bokharaiee et al., Blind Spectrum Sensing for OFDM-Based Cognitive Radio Systems, pp. 858-71, March 2011, IEEE Transactions on Vehicular Technology, Vol. 60, No. 3, IEEE; Akyildiz et al., Cooperative Spectrum Sensing in Cognitive Radio Networks: A Survey, pp. 40-62, 19 Dec. 2010, Physical Communication, Vol. 2011, Issue 4, Elsevier B.V.; and Yiicek et al., A Survey of Spectrum Sensing Algorithms for Cognitive Radio Applications, pp. 116-30, Feb. 2009, IEEE Communications Surveys & Tutorials, Vol. 11, No. 1, First Quarter 2009, IEEE. It is believed that these detection systems do not address the specific challenges and problems presented by HFC networks.

Once signal leakage is detected, there remains the task of locating the source of the leakage. Typically, leakage location involves patrolling an HFC network plant in a service truck equipped with a leakage detector and measuring leakage levels. Then, the location of the leak is estimated based on the leakage levels measured at different points along the patrolled route (or "drive route"). Leakage location becomes most difficult in urban areas due to multipath, which causes fading of signal levels and changes in direction of arrival of the leakage signal. Examples of such leakage location methods are found in the following patent documents: U.S. Pub. App. No. 2008/0133308 (Jun. 5, 2008) to Harris; and U.S. Pat. No. 7,360,124 to Bouchard (Apr. 15, 2008).

There are systems for locating leakage sources based on the use of triangulation and directional antennas. Examples of such systems are disclosed in the following patent documents: U.S. Pat. No. 7,945,939 (May 17, 2011); U.S. Pat. No. 7,548,201 to Eckenroth et al. (Jun. 16, 2009); U.S. Pub. App. No. 2008/0133308 (Jun. 5, 2008) to Harris; and U.S. Pat. No. 6,801,162 to Eckenroth et al. (Oct. 5, 2004). These systems are adversely impacted by multipath effects, especially in urban areas. A good reference book explaining such systems and the multipath problem is Anatoly Rembovsky et al., "Radio Monitoring, Problems, Methods, and Equipment," Springer Science+Business Media, LLC, NY, N.Y., 2009, Chapter 8 (pp. 237-316), (http://www.springer.com/la/book/9780387980997). The use of a directional antenna is not convenient in a patrolling truck, which is probably why these systems have not been widely adopted.

The QAM Snare® system by ARCOM DIGITAL, LLC, Syracuse, N.Y., locates sources of QAM signal leakage in HFC networks. The location methods used by QAM Snare® are described in U.S. Pat. Nos. 8,456,530 and 8,904,640. The preferred method employs the Time Difference of Arrival (TDOA) algorithm, which is based on measuring time delay of the leaked signal propagating from the headend to the leakage detector. Time delay is measured by sampling an originally transmitted QAM signal at the headend and sampling the same QAM signal as a leaked signal at a leakage detector. The sampling operation is synchronized at both ends by GPS synchronized clocks. The headend samples and the leakage samples are cross-correlated to create a cross-correlation peak (as previously indicated for detection). The position of the cross-correlation peak in the cross-correlation function provides a time delay to be used in the TDOA algorithm. With at least three time delay measurements at three different detection points, the TDOA algorithm is able to yield an accurate estimate of the leak's location. This method is very robust in a multipath environment, because all reflected signals (multiple signal paths) have some time delay offset from the main cross-correlation peak (true time delay) and thus can be distinguished. However, as discussed, this method may be a challenge to implement in modern HFC networks, because OFDM narrowcast signals are unique to each node, making it difficult to capture signal samples at each CMTS card.

Although modern HFC networks present challenges for leakage detection and location, the use of OFDM signals may present some opportunities. Unlike nearly random QAM signals, OFDM signals include some stable or periodic components, such as continuous pilot subcarriers ("pilots") and the Physical layer Link Channel (PLC) preamble (see, e.g., DOCSIS 3.1 specification, Sections 7.5.13.2 & 7.5.15.2 and FIGS. 7-55, 7-56 & 7-77). There are proposals to use OFDM pilots for detecting leakage of OFDM signals from HFC networks. See, for example: U.S. Pat. App. Pub. No. 2014/0294052 to Currivan et al. (Oct. 2, 2014) and U.S. Pat. App. Pub. No. 2015/0341810 to Murphy (Nov. 26, 2015). These proposals concern leakage detection and do not offer a leakage location solution beyond conventional GPS positioning of the leakage detector and signal level monitoring.

For the purpose of leakage detection, it would be advantageous for cable operators to assign the same frequency locations to some pilots for all narrowcast OFDM signals serving the different nodes in the HFC network. In such case, the content of the OFDM signals will remain unique at each node, consistent with the purpose of narrowcast channel programming. Also, with respect to the PLC preamble (hereinafter "PLC"), cable operators may consider locating the PLC at the same frequency location across all nodes, because the DOCSIS 3.1 specification (Section 7.5.13.2) encourages cable operators to locate the PLC in a "quiet" area of the downstream spectrum, i.e., where it would not be impacted by over-the-air interfering signals (e.g., wireless telephone communications at LTE frequencies).

The Inventor herein has recently proposed the use of the PLC for both detection and location of OFDM signal leakage in an HFC network. A system and method of doing so is disclosed and claimed in co-pending application Ser. No. 14/855,643, filed Sep. 16, 2015, naming the same inventor as herein. The system and method involves the prior creation of a signature of each OFDM signal (associated with each CMTS card and node). Each signature (in the form of samples) is a substitute for samples of the actual transmitted OFDM signal (as would be required in the prior QAM Snare® system discussed above). Thus, the use of signatures dispenses with the requirement of real-time samples to be taken at each CMTS card. The signatures are transmitted from a central server to a leakage detector patrolling the HFC network in the field. The samples of the signatures are cross-correlated with samples of received OFDM leakage signals. The cross-correlation is in synchronism with the period of transmission of the OFDM signals. This synchronized (coherent) cross-correlation produces time delay information of the leakage signal, which allows use of the TDOA algorithm for locating the leaks source.

Notwithstanding the merits of the above PLC method, the Inventor herein has considered whether another method could be devised to take advantage of the narrowband stable or periodic signal components of an OFDM signal. As a result, he has conceived the idea of using the principle of Doppler shift (a frequency shift caused by movement to and from a signal source) in a method of locating leakage sources in an HFC network. It is widely-known in navigation systems that narrowband signals (e.g., continuous wave (CW) signals) can be employed to implement a so-called Doppler method of locating signals sources. The Doppler method involves installing a narrowband radio receiver on a mobile platform (e.g., satellite, aircraft or truck). Due to the motion of the platform and receiver, the frequency of the received signal experiences a Doppler shift (a shift in frequency from its original center frequency). By measuring the Doppler shift at different points relative to an unknown signal source, an estimate can be made of the source's location. This is possible because Doppler shift varies depending on location and speed of the platform/receiver relative to the signal source. The Doppler location method is used in satellite navigation systems, such as the Cospas-Sarsat system, Montreal, Quebec, Canada (www.cospas-sarsat.int), and the Argos System (www.argos-system.org). Some articles have described successful test using the Doppler method to locate GSM (Global System for Mobile Communications or Groupe Spécial Mobile) base transceiver stations operating at 800 MHz. See, e.g., Piotr Gajewski, et al., Mobile Location Method of Radio Wave Emission Sources, Piers Online, Vol. 5, No. 5, August 2009, pp. 476-80, Military University of Technology, Poland (www.researchgate.net/publication/241687451_mobile_location_method_of_radio_wave_emission_sources).

The application of the Doppler method to the field of locating OFDM leakage in an HFC network is possible, because Doppler shift can be measured from a narrowband stable or periodic signal component of an OFDM signal (e.g., a dominant harmonic of a continuous pilot subcarrier), and because Doppler shift at LTE frequencies (e.g., 700 MHz) is large enough (e.g., tens of Hertz) even at low speeds of the service truck (e.g., 20-40 km/h).

Implementation of the Doppler method to locate signal leaks in an HFC network is not without challenges. The first challenge is dealing with multipath effects in urban areas. Reflections of the original leakage signal arrive at the deployed leakage receiver from different directions. Thus, the Doppler shift will be different for each reflected signal. As a result, the spectrum of the original leakage signal will be corrupted, which may yield erroneous Doppler shift measurements. Also, the reflected signals have different phases, which cause fading of the original leakage signal (i.e., a reduction in measured signal level). Fading reduces signal-to-noise ratio (SNR). A reduced SNR will also reduce the accuracy of Doppler shift measurement. The effect of multipath on Doppler shift measurements is addressed in the above-cited Gajewski article.

A second challenge in applying the Doppler method to HFC networks is the fact that, even with using IEEE Precision Time Protocol (or PTP IEEE1588) synchronization, the accuracy of the CMTS master clocks are still limited and will drift. For example, in a DOCSIS specification, entitled "Remote DOCSIS Timing Interface," CM-SP-R-DTI-I01-150615, p. 36, five levels of frequency synchronization performance is specified: from +/−5 PPB (Level 1 system) to +/−250 PPB (level 5 system). At LTE frequencies (e.g., 700 MHz), +/−5 PPB corresponds to +/−3.5 Hz and +/−250 PPB corresponds to +/−174 Hz. As a result, the actual frequency of the leakage signals in each CMTS serviced area will have some random offset or error from its nominal or specified value; and, the offsets are a priori unknown at the leakage detector. The range of expected Doppler shift at LTE frequencies for a truck speed of 100 km/h is only about +/−70 Hz (about 7 Hz per 10 km/h). Thus, the CMTS frequency offset could swallow-up the actual Doppler shift measurement. Without some solution, the application of the Doppler method to HFC networks is not an attractive idea.

Another challenge in applying the Doppler method to HFC networks is the potential for an ambiguity regarding the location of the leak. An ambiguity could arise in the scenario where a truck (equipped with a leakage detector) moves along a road and the leak is on one side of the road (a typical case). In such case, the Doppler shift may indicate that the leak location is on either side of road. The Doppler method, by itself, will not resolve the ambiguity.

OBJECTS AND SUMMARY OF THE INVENTION

It is therefore an object of the present invention to provide systems and methods of locating leaks in an HFC network that overcome the problems and drawbacks associated with the prior art.

It is another object of the present invention to provide systems and methods of locating leaks of an OFDM signal in an HFC network.

It is a further object of the present invention to provide systems and methods of locating leaks in an HFC network by measuring Doppler shift of leakage signals (or a signal component of leakage signals).

It is still another object of the present invention to provide systems and methods of locating a leak in an HFC network by measuring the Doppler shift of two predetermined harmonics of a leakage signal emitted from the leak.

It is a still further object of the present invention to minimize the effects of multipath on Doppler shift measurements, by measuring the Doppler shift of the leakage signal a number of times at each measurement point along a drive route ("drive-route point"), and averaging the results to obtain an averaged Doppler shift for each drive-route point.

It is yet another object of the present invention to provide systems and methods of locating a leak in an HFC network by measuring a Doppler shift of the leakage signal (or signal component of leakage signal) relative to an a priori known nominal frequency of the leakage signal (or signal component).

It is yet a further object of the present invention to provide a method of estimating a "zero" Doppler shift value from a distribution function of measured Doppler shift values (relative to nominal frequency), and a method of determining actual Doppler shift values from the estimated "zero" Doppler shift value and the measured Doppler shift values.

It is yet still another object of the present invention to provide a method of estimating a "zero" Doppler shift value and a "zero" Doppler shift point (where the zero Doppler shift value occurs) from a derivative function of the measured Doppler shift values (relative to nominal frequency), and a method of determining actual Doppler shift values from the estimated "zero" Doppler shift value and the measured Doppler shift values.

It is yet a still further object of the present invention to provide a method of resolving or avoiding ambiguities in estimating leak location by using an electronic map of the network under test.

It is yet still another object of the present invention to reduce and simply the necessary calculations or processing in locating a leak in an HFC network, by using an electronic map of the network and an estimate of a zero Doppler shift point.

These and other objects are attained in accordance with the present invention, wherein there is provided an apparatus or method for locating a leak in an HFC network extending over a geographic area. The leak emits a leakage signal over-the-air. The leakage signal includes a signal component defined by a nominal frequency. A preferred embodiment of the invention carries out the following steps or functions. First, a leakage detector or the like is moved through the geographical area of the HFC network, along a drive route, at one or more speeds of movement. Second, a speed of movement is recorded at each of a multiplicity of drive-route points along the drive route. Third, at each drive-route point, the signal component of the leakage signal is received at a received frequency. Fourth, for each drive-route point, the received frequency of the signal component is measured. Fifth, for each drive-route point, a measured Doppler shift value is determined from a difference between the received frequency and the nominal frequency of the signal component. Sixth, a zero Doppler shift value and a zero Doppler shift point are estimated based on at least the measured Doppler shift values of the drive-route points. Lastly, a location of the leak is estimated based on at least the estimated zero Doppler shift point.

In one case, the signal component of the leakage signal is a pilot subcarrier. In another case, the signal component may be a harmonic of the leakage signal. In a further case, the leakage signal may include a pilot subcarrier having a harmonic, and the signal component is the harmonic of the pilot subcarrier. In still another case, the leakage signal may include a pilot subcarrier having a dominant harmonic, and, in such case, the signal component is the dominant harmonic. In still a further case, the leakage signal is an OFDM signal containing a continuous pilot subcarrier having a dominant harmonic, and the signal component is the dominant of harmonic of the OFDM continuous pilot subcarrier. In yet another case, the leakage signal is an OFDM signal containing two continuous pilot subcarriers, each having a dominant harmonic, and the signal component is the dominant harmonics of the two continuous pilot subcarriers.

In a first particular embodiment, the step of estimating the zero Doppler shift value includes additional steps. In a first additional step, a Doppler shift range of potential zero Doppler shift values is determined for each drive-route point based on the measured Doppler shift value for the point and on the speed of movement recorded for the point. In a second additional step, a distribution of Doppler shift values (e.g., presented as a histogram) is determined from the values of the Doppler shift ranges. The distribution is defined by a graduated set of Doppler shift frequencies and, for each frequency, a totaled number of the Doppler shift ranges that contain the Doppler shift frequency. In a third additional step, the Doppler shift frequency having substantially the highest totaled number is selected from the distribution to be the estimated zero Doppler shift value. These additional steps for estimating the zero Doppler shift are collectively referred to as the "static algorithm."

In addition, or as an alternative, to the first particular embodiment, a second particular embodiment estimates the zero Doppler shift value and the zero Doppler shift point based on a change (dynamic) in measured Doppler shift. In a first step, a multiplicity of derivative values is determined from the measured Doppler shift values. Each derivative value represents a change in measured Doppler shift over an incremental distance along the drive route (e.g., the distance between a current drive-route point and a previous drive-route point). In a second step, a maximum value from the derivative values is identified. The maximum value is associated with a maximum value point along the drive route. In a third step, the zero Doppler shift point is estimated from the maximum value point. In a fourth step, an estimated Doppler shift value, associated with the maximum value point, is determined based on a function of the measured Doppler shift values and of the drive-route points associated with said values. In a fifth step, the estimated measured Doppler shift value is selected as an estimate of the zero Doppler shift value. These steps are collectively referred to as the "dynamic algorithm."

The second particular embodiment may be modified, in a third particular embodiment, to minimize errors (e.g., false maximums in the derivative function) caused by low amplitude of the received signal component or leakage signal. In a first step of the third particular embodiment, a level associated with the leakage signal is obtained at each of the multiplicity of drive-route points, thus producing a multiplicity of levels. The multiplicity of levels includes a maximum level and a plurality of threshold levels within a predefined threshold of the maximum level. In a second step, the measured Doppler shift values associated with the drive-route points from which the maximum level and threshold levels were obtained is selected. In a third step, a set of derivative values is determined from the selected measured Doppler shift values. Each derivative value is a function of a change in measured Doppler shift over an incremental distance along the drive route. In a fourth step, a maximum value from the set of derivative values is identified. The maximum value is associated with a maximum value point along the drive route. In a fifth step, the zero Doppler shift point is estimated from the maximum value point. In a sixth step, an estimated Doppler shift value associated with the maximum value point is determined based on a function of the selected measured Doppler shift values and of the drive-route points associated with the selected measured Doppler shift values. In a seventh step, the estimated Doppler shift value is selected as an estimate of the zero Doppler shift value. These steps are collectively referred to as the "modified dynamic algorithm."

In one embodiment of the present invention, the leak location is estimated by employing a triangulation procedure. Preliminarily to this procedure, an actual Doppler shift value is determined at each drive-route point from the measured Doppler shift value and the estimated zero Doppler shift value. Then, a plurality of the drive-route points are defined by a plurality of drive-route positions, respectively, relative to an estimated zero Doppler shift point. The drive-route positions may be specified by geographic (e.g., GPS) coordinates. The triangulation procedure employs a plurality of hypothetical Doppler shift values. The hypothetical values are a function of the speeds of movement at the plurality of drive-route points, respectively, and of the plurality of drive-route positions, respectively. In a first step of the triangulation procedure, a plurality of bearing vectors at the plurality of drive-route points, respectively, is determined based on the hypothetical Doppler shift values and on the actual Doppler shift values associated with the plurality of the drive-route points. In a second step, the plurality of bearing vectors are extended until the vectors intersect each other and create an intersection point or intersection zone. In a third step, the location of the leak is estimated to be at the intersection point or within the intersection zone.

In addition, or as an alternative, to the above-mentioned triangulation embodiment, an electronic network map procedure may be employed. If the map procedure is a supplement to the triangulation procedure, its purpose will be to confirm the location of the leak and/or to resolve a location ambiguity. In a first step of the map procedure, an electronic map of the HFC network is retrieved. The map contains a layout of the drive route, a plurality of devices of the network along the drive route, and a previously estimated zero Doppler shift point. In a second step, a line is projected substantially perpendicular to the drive route at the estimated zero Doppler shift point. In a third step, the location of the leak on the map is estimated by identifying a network device on the map to which the line is most closely directed. That device is considered the estimated location of the leak. If a map is employed in combination with triangulation, the leak location estimated under the triangulation procedure will be compared to the leak location estimated under the map procedure.

In the case where the leakage signal has multiple continuous pilot subcarriers (pilots), it is preferred (for leak location) to receive and work with the dominant harmonics of two different pilots. In a preferred embodiment for this case, a leak is located in an HFC network extending over a geographic area. The leak emits a leakage signal over-the-air. The leakage signal includes first and second continuous pilot subcarriers having first and second dominant harmonics, respectively. The first and second harmonics are defined by first and second nominal frequencies, respectively. In a first step of this embodiment, a leakage detector or other signal receiver is moved through the geographical area of the HFC network, along a drive route, at one or more speeds of movement. In a second step, the speed of movement at each of a multiplicity of drive-route points along the drive route is recorded. In a third step, at each drive-route point, the first and the second harmonics of the leakage signal are received at first and second received frequencies, respectively. In a fourth step, for each drive-route point, the first and the second received frequencies are measured. In a fifth step, for each drive-route point, a measured Doppler shift value is determined (i) from a first difference between the first received frequency and the first nominal frequency of the first harmonic, or (ii) from the first difference and a second difference between the second received frequency and the second nominal frequency of the second harmonic. In a sixth step, a zero Doppler shift value and a zero Doppler shift point are estimated based on at least the measured Doppler shift values of the drive-route points. Lastly, the location of the leak is estimated based on at least the estimated zero Doppler shift point.

To overcome measurement noise in the leak location process, such as erratic variations in Doppler shift measurements due to multipath, it is preferred to determine a number of measured Doppler shift values at about each drive-route point (e.g., within a one-second time interval), and then to average those values to produce an averaged result for each drive-route point. Thus, in a preferred embodiment, the previously recited steps of (1) receiving the harmonics, (2) measuring the received frequencies of the harmonics, and (3) determining a measured Doppler shift value from one or both of the received frequencies and corresponding nominal frequencies, are repeated a number of times for each drive-route point. Thus, a number of measured Doppler shift values are produced for each drive-route point. For each drive-route point, these values are averaged together to produce an averaged Doppler shift value. Finally, the averaged Doppler shift values are used to estimate the zero Doppler shift value and the zero Doppler shift point.

BRIEF DESCRIPTION OF THE DRAWING

Further objects of the present invention will become apparent from the following description of a preferred embodiment with reference to the accompanying drawing, in which:

FIG. 3A shows one dominant harmonic at the center frequency of the pilot, FIG. 3B shows two symmetrical dominant harmonics having a maximum off-set from the center frequency, and FIG. 3C shows one dominant harmonic whose frequency is at some offset $\Delta f$ from the center frequency;

DETAILED DESCRIPTION OF THE PREFERRED EMBODIMENT

Figure 1:
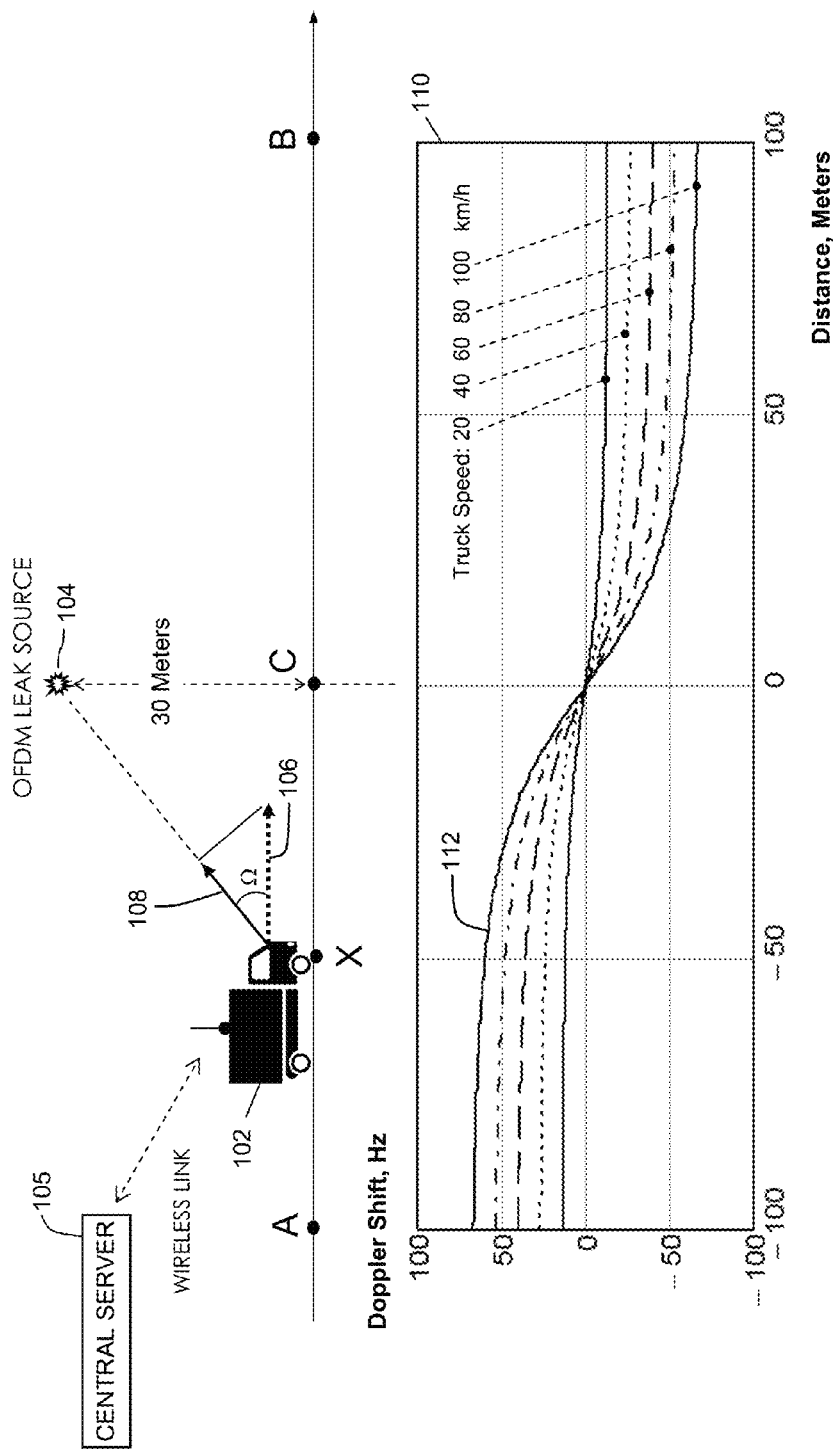
FIG. 1 is a schematic diagram illustrating the basic principle of a Doppler method applied to an HFC network for locating a leak in the network, and showing a graph of hypothetical Doppler shift curves depending on truck speed and distance to and from a general leak location.

Referring now to FIG. 1, there is shown the basic principle of a Doppler method applied to an HFC network for locating a leak in the network. FIG. 1 also represents a typical scenario of monitoring signal leaks in an HFC network. For instance, a cable operator's service truck 102 (equipped with a leakage detector) patrols the area of the cable network to detect and locate signal leaks. In the illustrated scenario, truck 102 drives from point A to point B along a drive route A-B. A leak or leakage source 104 is located at some point off drive route A-B and emits a leakage signal. The leakage detector on truck 102 includes a GPS time sync module (FIG. 7) for providing geographic coordinates of measurements along the drive route, timestamps, and a stable clock signal. Also the leakage detector includes a wireless modem (FIG. 7) for communicating with a central server 105 in real time. The leakage detector will be discussed in greater detail with reference to a block diagram shown in FIG. 7. A typical range of distances between leak 104 and the nearest point C of drive route A-B is from one (1) to one-hundred (100) meters. An average distance of 30 meters is shown in FIG. 1.

When truck 102 moves along route A-B, in the general direction of leak 104, from point A to point C, the frequency of the leakage signal from leak 104 (as received by the leakage detector) is increased by a Doppler shift. When truck 102 moves from point A to point C (drawing nearer to leak 104), the Doppler shift will be a positive number (i.e., frequency of leakage signal increases), and when truck 102 moves from point C to point B (moving away from leak 104), the Doppler shift will be a negative number (i.e., frequency of leakage signal decreases). The relationship of Doppler shift versus distance to and away from point C is shown in graph 110 for a leakage signal at 700 MHz, for different truck speeds. When truck 102 is at point C, at the nearest point to leak 104 along route A-B, the Doppler shift measured at truck 102 equals zero. In graph 110, five Doppler shift curves 112 are shown, each curve representing a different truck speed (as noted). Each curve 112 passes through zero Doppler shift at zero distance (representing point C). Each curve 112 represents an interval of Doppler shifts ranging from positive to negative values, depending upon position along route A-B. The curve with the narrowest Doppler shift interval is produced by a speed of 20 km/h, and the interval is about −10 Hz to +10 Hz (at 700 MHz). The curve with the widest Doppler shift interval is produced by a speed of 100 km/h, and the interval is about −60 Hz to +60 Hz (at 700 MHz). The accuracy of Doppler shift measurements should be at least 1 Hz, or one-tenth of the maximum Doppler shift value (10 Hz) for the lowest expected truck speed (20 km/h). An accuracy of 1 Hz is required to provide adequate sensitivity at the lowest truck speed. To achieve an accuracy of 1 Hz at 700 MHz, the reference clock must have an accuracy of at least $+/-1 \times 10^{-10}$. This accuracy is provided in commercially available GSP time sync modules (typically $+/-1 \times 10^{-11}$).

Doppler shift depends on the speed and position of truck 102, the frequency of the received leakage signal, and the leak's location relative to drive route A-B. In FIG. 1, at some drive-route point X a vector 106 represents the magnitude of the speed and the direction of truck 102. The magnitude of vector 106 is also proportional to a hypothetical Doppler shift value, which follows the relationship of one of the curves 112 (in FIG. 1). The hypothetical value is based on a hypothetical signal source at point C, the actual speed of truck 102, and the actual position of truck 102 at point X. Vector 106 has a projection or bearing vector 108 in the actual direction of leak 104. Vector 108 represents the speed in the direction of leak 104 and thus the actual Doppler shift experienced by truck 102 at point X. This actual Doppler shift cannot be measured directly, but is related to the Doppler shift actually measured at point X (the difference being the initially unknown frequency error (FEcmts) in the CMTS clock). Vector 108 is proportional to vector 106 by the cosine function. Therefore, by measuring the Doppler shift at point X and knowing the magnitude of vector 106 (i.e., using the speed of truck 102, distance between points X and C, and hypothetical Doppler shift value from curve 112), the angle $\Omega$ between vectors 106 and 108 can be calculated. However, before this calculation can be done, the measured Doppler shift values must be converted to actual Doppler shift values. This is done in accordance with embodiments of the present invention described later (see FIGS. 13 & 14 and accompanying description). Once angle $\Omega$ is calculated, the direction between point X and leak 104 becomes known. The location of leak 104 can be estimated by determining a plurality of directions between different drive-route points (X) and leak 104, and using a triangulation formula or algorithm (see FIG. 15). The present invention also offers an alternative to the triangulation algorithm (see FIG. 16).

In accordance with the present invention, the Doppler shift of an OFDM leakage signal (or signal component of the leakage signal) is measured by first detecting the OFDM leakage signal. Detection is accomplished, in the preferred embodiment, by detecting a dominant harmonic of one or more pilots of the OFDM leakage signal. The fundamental principles of this method of detection is disclosed in co-pending application Ser. No. 14/936,551, filed Nov. 9, 2015, by the same inventor as herein, and will be presented herein with reference to FIGS. 2-5. Generally, this method of detection involves: (1) tuning a leakage detector to receive a dominant harmonic(s) of a selected pilot in an OFDM leakage signal; (2) validating that the harmonic(s) has been detected and is from the OFDM leakage signal; and (3) calculating the leakage level of the OFDM leakage signal. This method of detection will be referred to herein as the "pilot harmonic detection method."

Figure 2:
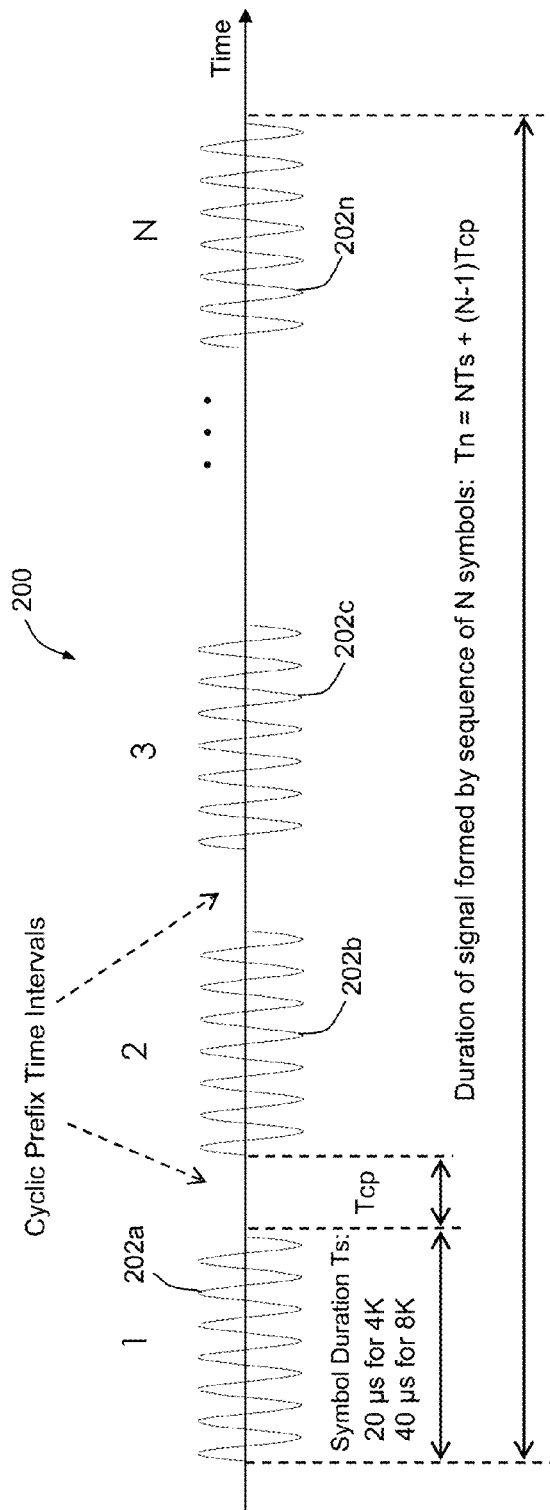
FIG. 2 illustrates a continuous pilot subcarrier ("pilot") of an OFDM signal in the time domain.

To understand the pilot harmonic detection method, a description of a predefined continuous pilot subcarrier belonging to a DOCSIS 3.1 OFDM signal is now presented. FIG. 2 illustrates a pilot 200 in the time domain. Pilot 200 includes a periodic sequence of N coherent pulses 202a-202n, each with a stable initial phase of 0 or 180 degrees, and each having a symbol duration Ts. Pilot 200 has a symbol period of Ts+Tcp, where Tcp is the cyclic prefix duration. Pilot 200 has a signal duration Tn. The frequency of each pulse 202a-202n is equal to the center frequency of the pilot:

$$f\text{pilot } i = (\text{pilot number ``}i\text{''} - Idc) \times f\text{sub} \quad (1),$$

where: fsub equals 50 kHz for 4K FFT mode and 25 kHz for 8K FFT mode; Idc is the DC subcarrier in the OFDM symbol, having subcarrier number 2048 for 4K FFT mode and 4096 for 8K FFT mode; "i" is the pilot subcarrier number in the OFDM symbol under the DOCSIS 3.1 specification ("i"=0, 1, 2 . . . 4095 for 4K FFT mode and "i"=0, 1, 2 . . . 8191 for 8K FFT mode). The subcarrier number may be specified relative to the DC subcarrier number. It is known that the spectrum of pilot 200 looks like a number of discrete harmonics (see FIGS. 3A-3C). In the preferred embodiment herein, it is the dominant harmonic(s) of the pilot spectrum that is (are) selected for detection.

The energy of the harmonics of a pilot spectrum is low compared with the energy of the entire OFDM signal, of which the pilot is a part. Thus, good sensitivity is required to detect the harmonics. To achieve adequate sensitivity, a very narrow resolution bandwidth (RBW) should be used in an FFT processor used for detection. The RBW should be a few Hz (e.g., 1-10 Hz). However, the detector should be fast enough to detect leaks at least a few times per second (e.g., 2-10 times per second). Obviously, to satisfy both the RBW and speed requirements, the bandwidth of the detector should be narrow enough for a reasonable FFT mode and RBW. For example, if a 2K FFT mode is used in an FFT processor with a 10 Hz RBW, then there will be a calculation of 2048 frequencies in the spectral domain requiring a total bandwidth of 2048×10 Hz=20.48 kHz. This total bandwidth pertains to a complex spectrum. Thus, half of this bandwidth, or approximately 10 kHz, may be selected as the bandwidth of an FFT processor (at least for harmonic detection and level measurement—see further discussion below).

In order to carryout detection of pilot harmonics in a leakage detector, certain pre-identified or predetermined (nominal) parameters concerning the harmonics are employed. They include: (1) the "nominal" RF frequency of each dominant harmonic to be detected (Fharm i); (2) calculated frequency offsets between the dominant harmonics to be detected (FOharm i, i+n); and (3) the relative amplitude or level of each dominant harmonic to be detected (i.e., the signal strength level of the harmonic relative to the total energy of the associated pilot—RLharm i). The first parameter is used to tune a down-converter of a tuner in the front-end of a leakage detector. The second parameter is used to validate that the detected harmonic is from an actual OFDM leakage signal. The third parameter is used to calculate the OFDM leakage level (field strength) based on a measured signal strength level of the detected harmonic. The term "nominal" in reference to frequency means a specified frequency, or a calculated frequency based on specified parameters, or a measured frequency using an ideal master clock (e.g., 10.24 MHz clock used to form the OFDM signal at a CMTS). A nominal frequency of a pilot in an OFDM signal is calculated based on the OFDM mode (4K or 8K), the cyclic prefix, number of pilot in the OFDM symbol, and the RF center frequency of the OFDM signal. See discussion above and DOCSIS 3.1 specification, e.g., Section 7.5.15.2.

Figure 3A:
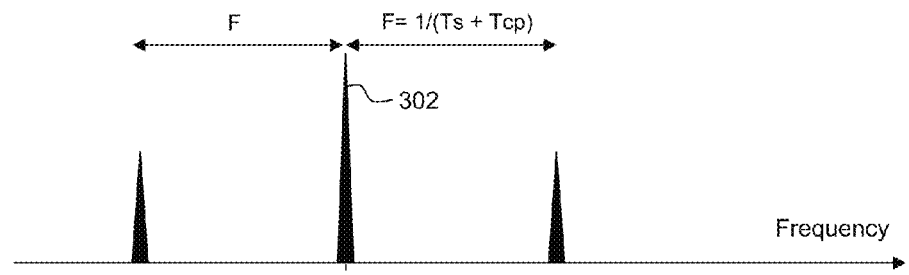
FIGS. 3A-3C illustrates three scenarios for the dominant harmonic(s) of a pilot, where
Figure 3B:
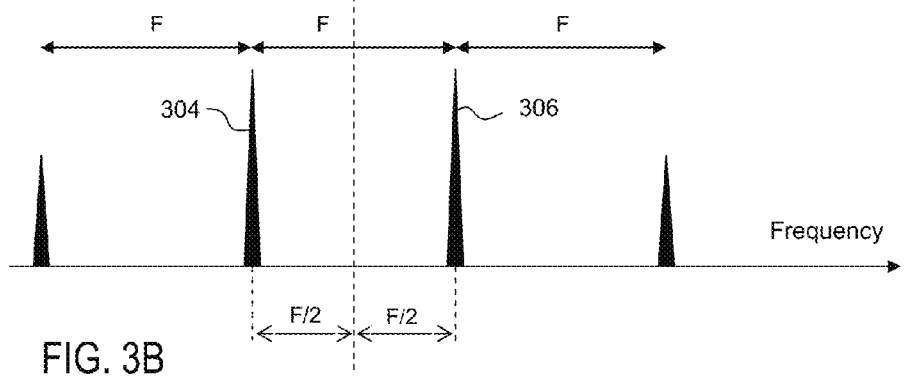
Figure 3C:
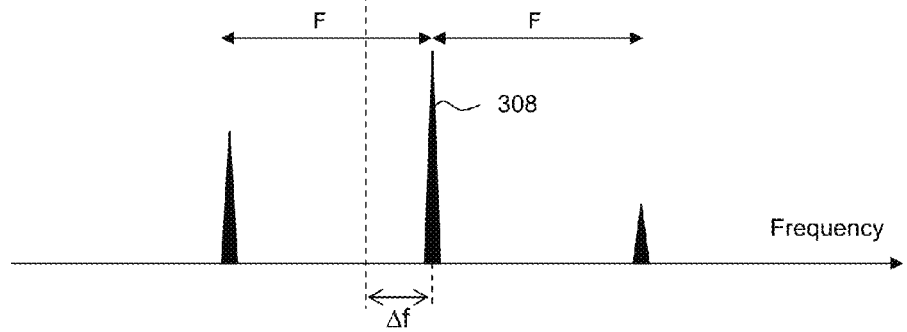

Three harmonic scenarios for the dominant harmonic(s) of a pilot are shown in FIGS. 3A-3C. These scenarios depend on the FFT mode, pilot or subcarrier number "i" in the OFDM signal (or symbol), and the cyclic prefix duration Tcp (e.g., 5 µs; 3.75 µs; 2.5 µs; 1.25 µs; 0.9375 µs). The frequency spacing F between harmonics of a pilot is equal to the inverse of the symbol period (Ts+Tcp) of the pilot, i.e., F=1/(Ts+Tcp). FIG. 3A shows the scenario of one dominant harmonic 302 located at the center frequency (fpilot) of the pilot. This scenario will occur when there are an integer number of (sine wave) periods of the pulses of the pilot that are within the cyclic prefix duration Tcp. The sine wave period is defined as ppilot=1/fpilot. For example, Tcp=5 microseconds and the pilot frequency fpilot=10 MHz; thus ppilot=1/10 MHz=0.1 microseconds, and Tcp/ppilot=5/0.1=50, which is an integer number representing 50 periods within Tcp. Therefore, this 10 MHz pilot would produce the harmonic scenario of FIG. 3A, where the level of the dominant harmonic is at its maximum.

FIG. 3B shows the opposite scenario, where there are two dominant harmonics 304, 306 and they have a minimum level and a maximum offset F/2 from the center frequency of the pilot (fpilot). This will occur when an odd integer number of half periods (ppilot/2) of the pilot is within the cyclic prefix duration Tcp, or $$Tcp/(p\text{pilot}/2) = \text{odd integer number.}$$

For example, in the 4K FFT mode (50 kHz subcarrier spacing) with Tcp=5 microseconds, and pilot subcarrier number "i"=2058, then fpilot=(i−2048)·50 kHz=500 kHz and ppilot=2 microseconds. Therefore, Tcp/(ppilot/2)=5/(2/2)=5, which is an odd integer number representing 5 half periods within Tcp.

FIG. 3C shows an intermediate or general case, where one dominant harmonic 308 is offset from the center frequency (fpilot) of the pilot by a frequency value, Δf, where Δf is less than the maximum offset F/2. Any of the scenarios of FIGS. 3A-3C may be involved in the calculation of the RF frequency of dominant harmonics (a nominal parameter) and other nominal parameters.

Dominant harmonics 302, 304, 306, and 308 (in FIG. 3) are each essentially a continuous wave (CW) signal, and thus its detection is a simpler problem than detecting the entire OFDM leakage signal or even the pilot or pilots of the OFDM leakage signal. The CW dominant harmonics can be detected in a straightforward manner using an FFT processor. The detection sensitivity of a CW dominant harmonic with Tn=100 ms is approximately −100 dBmV. This sensitivity makes it possible to detect an ODFM leakage signal with a field strength (over 6 MHz bandwidth) as low as 1 µV/m, which is more than adequate for detecting leakage signals in an HFC network at LTE frequencies (e.g., 700-752 MHz). The resolution bandwidth of the FFT processor is preferably about 10 Hz, and the accuracy of measuring a dominant harmonic's frequency will be within 1 Hz due to the use of a very stable reference clock in the GPS time sync module of the leakage detector. This accuracy is sufficient for measuring the Doppler shift of an OFDM signal leaking from an HFC network, because the change in Doppler shift is about 7 Hz per 10 km/h (at 700 MHz). Thus, 1 Hz should provide sufficient sensitivity of measuring Doppler shift, even at truck speeds less than 10 km/h.

Figure 4:
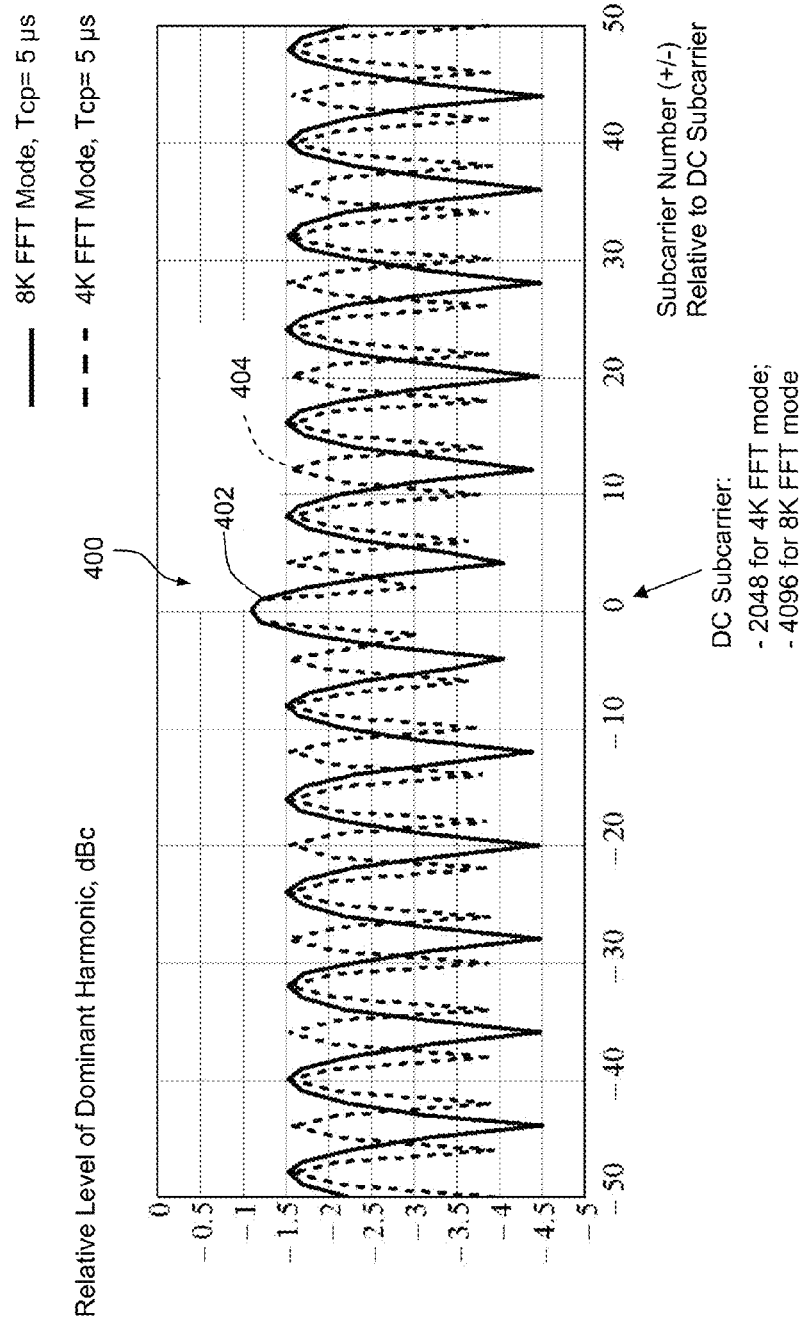
FIG. 4 is a graph of the relative amplitude (or level) in dBc of a dominant harmonic of a pilot versus subcarrier number in an OFDM signal, for an 8K FFT mode (solid line) and a 4K FFT mode (broken line), and a cyclic prefix duration of 5 microseconds.

Referring now to FIG. 4, there is shown a graph 400 of relative amplitude (or level) of a dominant pilot harmonic versus the pilot subcarrier number "j" relative to the DC subcarrier in the OFDM symbol, i.e., j=pilot number "i"−Idc (see equation (1)). The relative amplitude values plotted in graph 400 were calculated in dBc (or decibels relative to carrier), and each value represents the amplitude of a dominant harmonic relative to the total energy of the pilot associated with that harmonic. Graph 400 is centered at a DC subcarrier and extends 50 subcarriers in plus and minus directions. Graph 400 includes a solid line plot 402 and a broken line plot 404. Plot 402 represents the relative amplitude of the dominant harmonic in the 8K FFT mode (Tcp=5 microseconds), and plot 404 represents the relative amplitude of the dominant harmonic in the 4K FFT mode (Tcp=5 microseconds). Plots 402 and 404 are periodic functions that continue in like manner over the full set of subcarriers (or pilot or subcarrier numbers) in the OFDM signal (or symbol). Plots 402 and 404 are symmetric about the DC subcarrier. The period of plots 402, 404 are dependent on Tcp. For example, as explained with respect to FIG. 3A, the maximum of the dominant harmonic occurs under the condition of Tcp/ppilot=integer number. Tcp/ppilot=Tcp·(fpilot)=Tcp(i−Idc)×fsub. With Tcp=5 microseconds and 8K FFT mode, the maximum of the function of plot 402 is at subcarriers j=0, +/−(8, 16, 24 . . . ), i.e., with a period of 8 subcarriers, because Tcp×(i)×(fsub)=(5×10^−6)×(8)×(0.025×10^6)=1, where 1 is the minimum integer value. If Tcp=2 microseconds, the period of plot 402 would be 20 subcarriers, because 2×20×0.025=1. The relative amplitude or level of the dominant harmonic (RLHarm j) is used to calculate a level of the OFDM leakage signal (a nominal parameter).

The frequency offset of the dominant harmonic from the center frequency of the pilot is defined by an equation (2):

$$\Delta f(Hz) = 1/(Ts+Tcp) \text{round}(fpilot(Ts+Tcp)) - fpilot \quad (2)$$

where fpilot is the center frequency of the pilot after IDFT (equation (1)), Ts equals 20 microseconds for the 4K FFT mode and 40 microseconds for the 8K FFT mode, and "round" means rounding to an integer. As an example, assume the following parameters: Ts=20 microseconds (4K FFT mode); Tcp=5 microseconds; and fpilot=12.5 MHz. Then, $$\Delta f(Hz) = 10^6/(20+5) \text{round} (12.5(20+5)) \times 12.5 \times 10^6 \text{ Hz}$$

$$= 40,000 \text{ round}(312.50) - 12.5 \times 10^6 \text{Hz}$$

$$= 40,000 \times 313 - 12.5 \times 10^6 \text{ Hz} = 20,000 \text{ Hz or } 20 \text{ kHz}.$$

Figure 5:
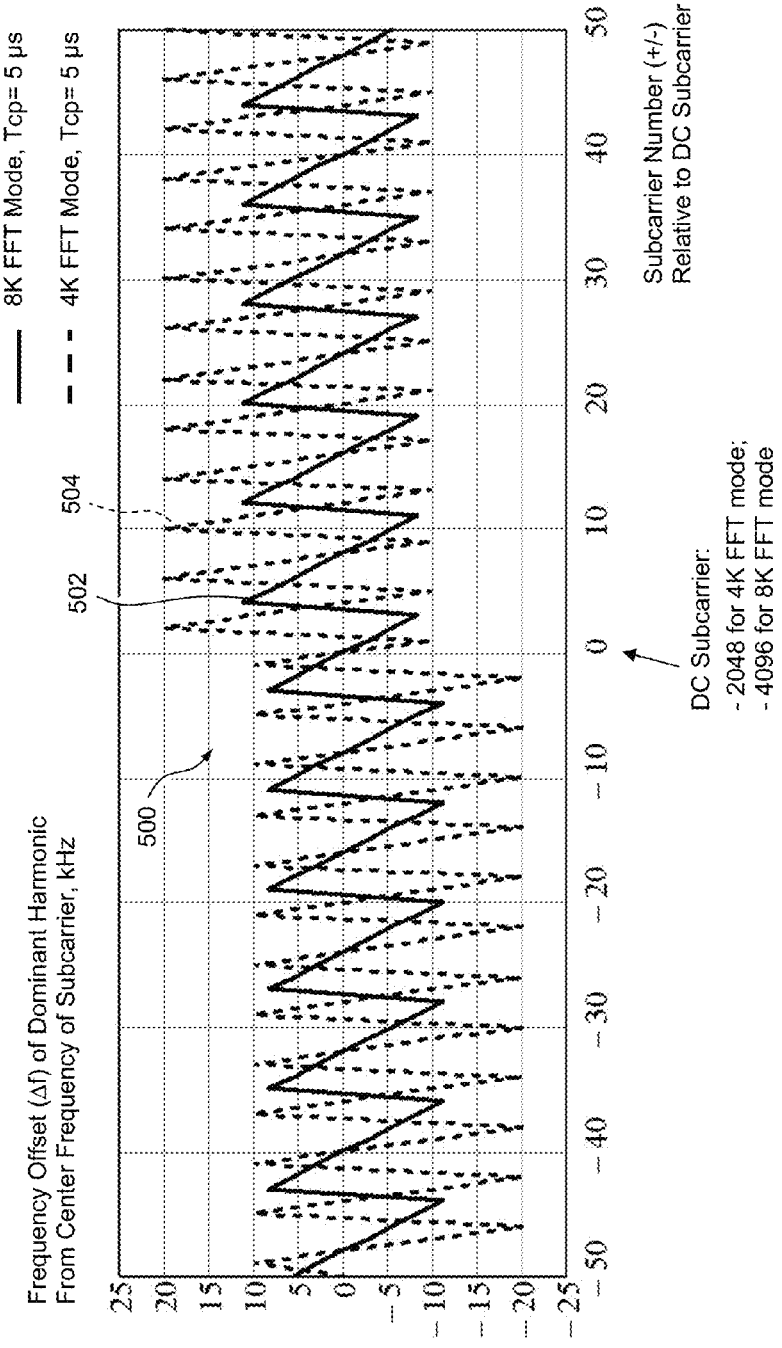
FIG. 5 is a graph of a frequency offset $\Delta f$, in kHz, of the dominant harmonic from the center frequency of the pilot versus the subcarrier number in the OFDM signal, for the 8K FFT mode (solid line) and the 4K FFT mode (broken line), and a cyclic prefix duration of 5 microseconds.

FIG. 5 shows a graph 500 of the frequency offset Δf, in kHz, versus the pilot subcarrier number "j" relative to the DC subcarrier in the OFDM symbol, i.e., j=i−Idc. Graph 500 is centered at the DC subcarrier and extends 50 subcarriers in the plus and minus directions. Graph 500 includes a solid line plot 502 and a broken line plot 504. Plot 502 represents Δf in the 8K FFT mode (Tcp=5 microseconds) and plot 504 represents Δf in the 4K FFT mode (Tcp=5 microseconds). Plots 502 and 504 are periodic functions that continue in like manner over the full set of subcarriers (or subcarrier numbers) in the OFDM signal (or symbol). Plots 502 and 504 are asymmetric about the DC subcarrier. The period of plots 502, 504 are also dependent on Tcp. For example, as explained with respect to FIG. 3B, the maximum frequency offset (F/2) of a dominant harmonic occurs under the condition of Tcp/(ppilot/2)=odd integer number of half periods. Tcp/(ppilot/2)=2Tcp/ppilot=2Tcp·(fpilot)=2Tcp(i−Idc)× fsub)=2Tcp×j×fsub. With Tcp=5 microseconds and 4K FFT mode, the maximum offset will be at j=+/−(2, 6, 10 . . . ), because 2Tcp×j×(fsub)=(2×5×10^−6)×(+/−2)×(0.050×10^6)=+/−1, where 1 is the minimum odd integer number of half periods. So, the period of maximum frequency offset in plot 504 is 4 subcarriers. Δf is used to locate the RF frequency of the dominant harmonic (a nominal parameter).

Calculations of the nominal parameters of OFDM dominant harmonics to be detected by a leakage detector will now be presented. First, data server 105 (FIG. 1) retrieves from all CMTS's (serving the HFC network under test) the following information: the FFT mode (4K or 8K); cyclic prefix duration Tcp (μs); the subcarrier numbers "i" of the pilots; and the center frequency of the DC subcarrier at RF. Server 105 then calculates the center frequency RFpilot i of selected pilots or of each pilot in the RF band by using the equation:

$$RFpilot\ i = fpilot\ i + F\ dc,$$

where "i" is the pilot subcarrier number in the OFDM symbol and F dc is the center frequency of the DC subcarrier at RF (both obtained from CMTS). The subcarrier numbers utilized in this calculation may only be a small subset of a complete set of subcarrier numbers (e.g., 4096 or 8192) for an OFDM symbol, where the subset of numbers may be those close to or within the frequencies of anticipated OFDM leakage signals.

Server 105 then uses equation (2) to calculate, for each selected pilot subcarrier number "i", the frequency offset (Δfi) of the dominant harmonic from the center frequency of each pilot, where the center frequency of each pilot is defined by equation (1).

Server 105 then calculates the RF frequency(s) of the dominant harmonic(s) for each selected pilot, using the equation:

$$Fharm\ i = RFpilot\ i + \Delta fi.$$

Server 105 then calculates the relative amplitude or level of the dominant harmonic(s), in dBc, for each selected pilot, for example, using the equation:

$$RLharm\ i(dBc) = 20\ \text{Log}(\text{Max}(FFT\ (fpilot\ i, Ts, Tcp, Tn))/\text{Sum}(FFT\ (fpilot\ i, Ts, Tcp, Tn))$$

where the FFT is a DFFT function of the time-domain version of the pilot (e.g., signal 200 in FIG. 2), with parameters fpilot, Ts, Tcp, and signal duration Tn. The minimum signal duration Tn of the pilot is defined by the required RBW of the FFT processor in the leakage detector, by the relationship: Tn (sec)=1/RBW (Hz). For example, if the required RBW=10 Hz, then the minimum Tn=100 ms.

Server 105 then calculates the frequency offset, FOharm (i, i±n), between the RF frequencies of two dominant harmonics of two different pilots. FOharm(i, i+n) is used to validate the detection of the harmonics and the OFDM leakage signal to which the harmonics belong. Server 105 then compiles in a data file the nominal parameters—Fharm i, RLharm i, and FOharm(i, i±n)—for each dominant harmonic intended to be used for leakage detection and Doppler shift measurement. These data files may be sent to the leakage detector in the field via a wireless phone link for use by the leakage detector to tune to the appropriate harmonics, validate detection and calculate leakage level. If the HFC network has nodes (or service areas) serviced by different CMTS's and the OFDM signals generated by the CMTS's are different for each node or service area, then a data file of nominal parameters for each node or service area can be compiled by server 105 and sent to leakage detector.

A method of validating the detection of dominant harmonics and, accordingly, detection of an OFDM leakage signal to which the harmonics belong, is now described in some detail. The validation method is preferably employed to prevent false alarms and false leakage and Doppler shift data. In a first step of the validation method, the dominant harmonics of two different pilots are detected by a leakage detector, and the frequency offset between the harmonics (FOharm) is measured. The leakage detector contains a GPS time sync module with a stable GPS synchronized clock (see FIG. 7). The clock is used for detection of both harmonics; thus, Doppler shift and frequency instability factors do not substantially affect the accuracy of measured FOharm (i.e., they are substantially subtracted out in determining the measured offset). Thus, FOharm can be relied upon as a robust parameter for validating an actual OFDM leakage signal. Recall, one of the nominal parameters (of an OFDM signal expected to be detected as a leakage signal) is FOharm(i, i±n) (i.e., the calculated FOharm). In a second step of the validation method, the measured FOharm is compared with the calculated FOharm. If the measured FOharm is close to (within a few Hz of) the calculated FOharm, then a decision is made in the leakage detector (e.g., block 712 or CPU 713 in FIG. 7) that the detected harmonics are valid and belong to actual pilots of the OFDM leakage signal. The object is to detect the dominant harmonic(s) of an OFDM leakage signal in order to establish detection of the OFDM leakage signal.

After validation, the level of the OFDM leakage signal ("leakage level" or "level of the leak") is calculated from the measured level of each detected dominant harmonic and the relative level (RLharm i) of each dominant harmonic (RLharm i is a pre-determined and stored nominal parameter). If the OFDM leakage level is considered measured over a 6 MHz bandwidth, then, for the 8K FFT mode, the leakage level can be defined, for example, by the following equation:

Leak Level (dBmV/m)=Harmonic Level (dBmV)−
RLharm (dBc)+AF(dB/m)+10 Log(6 MHz/25
kHz)−6 dB       (3)

where AF is the antenna factor and 6 dB is the boosting value of a pilot. According to the DOCSIS 3.1 specification, pilots are boosted 6 dB relative to the level of data subcarriers in an OFDM signal.

As indicated generally before, the sensitivity required to detect a dominant harmonic is achievable. If a leakage level to be calculated is—40 dBmV (10 µV/m)@6 MHz, and AF=25 dB/m (e.g. dipole at LTE band 750 MHz), and RLharm=−4.5 dBc (worst case), then the detected level or sensitivity S of the FFT processor (e.g., FFT processors 710, 711 in FIG. 7) would be:

S (dBmV)=−40 dBmV−4.5 dBc−25 dB/m−23.8+6
dB=−87.3 dBmV or −136 dBm

This sensitivity is achievable with a RBW of about 10 Hz for a FFT processor, and using a threshold level of 10-15 dB below the noise floor, and assuming a typical noise figure for the receiver.

In a preferred embodiment of the present invention, at least two dominant harmonics of at least two pilots, respectively, are selected for both validation of detection and Doppler shift measurements. As will be understood from the description below, the detection of at least two dominant harmonics and the measurement of Doppler shift from the two harmonics will help in reducing multipath effects in the final Doppler shift measurement (i.e., reduce measurement noise caused by multipath). In a preferred implementation, the selected pilots are the outermost pilots on each end of a 6 MHz channel containing the PLC (see FIG. 6; 608 & 610). The 6 MHz channel containing the PLC is referred to herein as the "PLC channel." The dominant harmonic of each of these outermost pilots is selected for detection and Doppler shift measurement. It should be noted that the present invention is not limited to using harmonics of pilots in the PLC channel. According to the DOCSIS 3.1 specification, pilots are distributed over the OFDM spectrum (e.g., 192 MHz) with spacing of about 3.5 to 4 MHz. The dominant harmonics of any of these pilot frequencies and any frequency spacing can be selected. However, the PLC channel is convenient for leak detection and Doppler measurement, because the location (in frequency) of the PLC channel is likely to be the same for all CMTS's. This means that the leakage detector would not require a PLC channel frequency specification for each CMTS-serviced area (e.g., for each node). Also, the PLC is expected to be placed in some "quiet" bandwidth, away from the frequencies of most over-the-air interference signals. Thus, the leakage detector will be able to detect the leakage signal (i.e., the dominant harmonics of pilots) without being significantly impacted by off-air interference.

Figure 6:
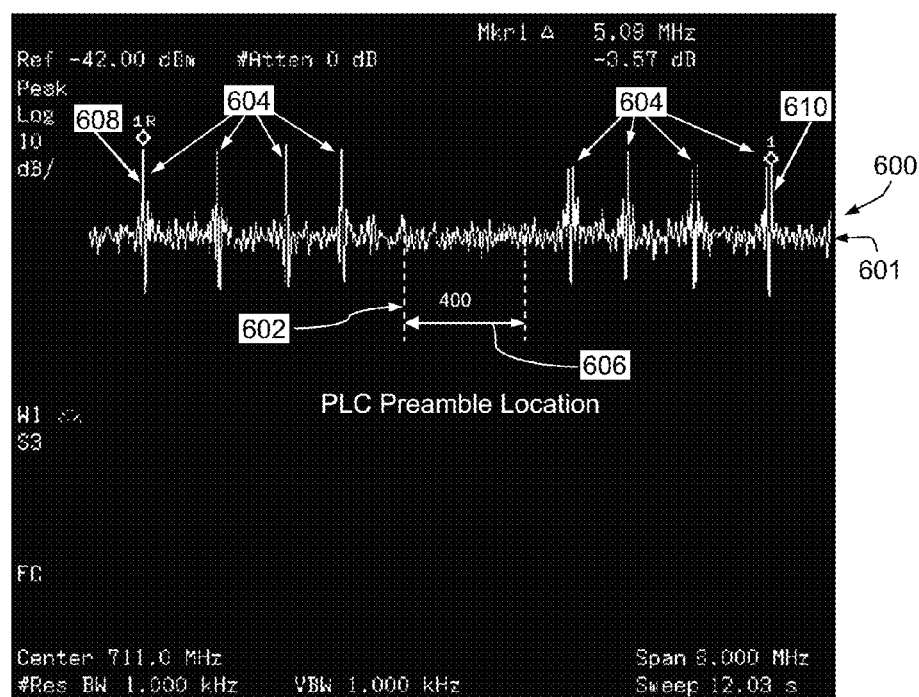
FIG. 6 is a frequency spectrum trace of part of an OFDM signal containing a 400 kHz wide PLC and eight predefined continuous pilot subcarriers disposed about the PLC.

FIG. 6 shows a spectrum analyzer trace 600 of part of an OFDM signal. The part shown in trace 600 is a 6 MHz wide PLC channel 601. PLC channel 601 encompasses a PLC 602 and eight predefined continuous pilot subcarriers 604 disposed about PLC 602. PLC 602 is located at the center of PLC channel 601. This structure is described in the DOCSIS 3.1 specification at Sections 7.5.13.2 & 7.5.15.2 and FIGS. 7-55, 7-56 & 7-77. PLC 602 has a bandwidth 606 of 400 kHz. The signal of PLC 602 looks like noise. As indicated, it is preferred (for leakage detection validation and Doppler shift measurement) to select the two outermost pilots (their dominant harmonics) in PLC channel 601. These pilots are shown in FIG. 6 as pilots 608 and 610, and they are spaced from each other by about 5.10 MHz. The dominant harmonics of pilots 608 and 610 are similarly spaced. As indicated by markers ◇ in FIG. 6, the dominant harmonics are 5.09 MHz apart. This spacing is essentially the maximum frequency offset for dominant harmonics within PLC channel 601. An increase in immunity to multipath effects can be achieved by choosing the two dominant harmonics at a maximum frequency offset in PLC channel 601. The actual value of maximum frequency offset will depend on the actual location of the associated pilots in the OFDM symbol and the cyclic prefix duration, as already discussed with reference to FIGS. 3A-3C.

Figure 7:
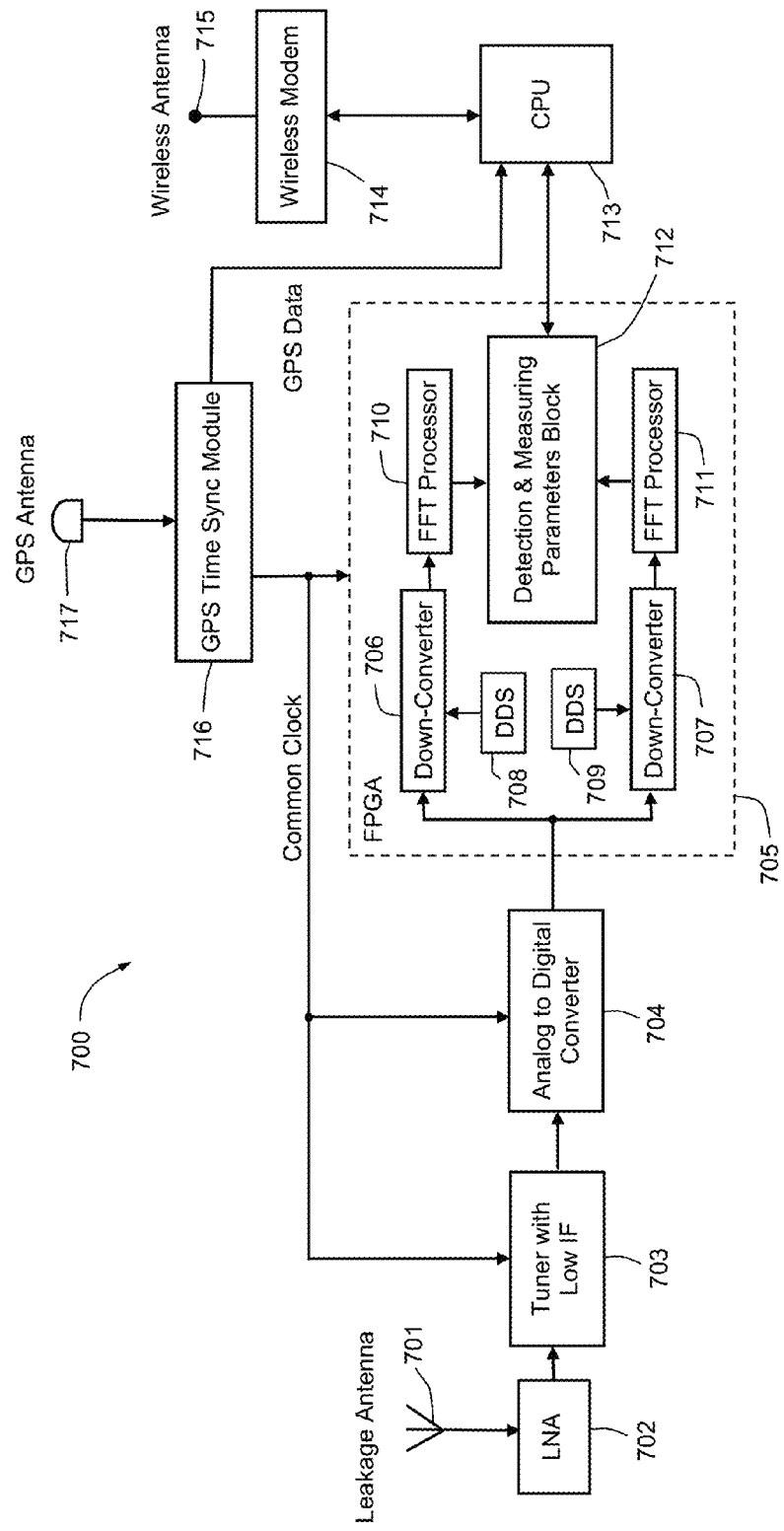
FIG. 7 is a block diagram of one embodiment of a leakage detector having a Doppler shift measurement capability, in accordance with the present invention.

A block diagram of a leakage detector 700 is shown in FIG. 7. Detector 700 is an exemplary embodiment of the leakage detection component or function of the present invention. An RF OFDM leakage signal is received by an antenna 701, amplified by a low noise amplifier (LNA) 702, and then down-converted at a tuner 703 to a low first intermediate frequency ("first IF") (e.g., 5 MHz center frequency within 6 MHz bandwidth). In modern tuners, first IF is typically from 3 to 8 MHz with an IF bandwidth of 1 to 10 MHz. Thus, tuner 703 can select up to a 10 MHz wide part of the OFDM leakage signal and down-convert it to a low (e.g., 5 MHz) IF ("first IF signal"). In a preferred embodiment, the first IF signal is selected to be the PLC channel of the OFDM leakage signal, having a bandwidth of 6 MHz and being centered at 5 MHz (first IF). In the latter case, the first IF signal contains eight pilots (e.g., pilots 604 in FIG. 6) including their harmonics. After tuner 703, the first IF signal is digitized in an analog-to-digital converter (ADC) 704 and the resulting digital samples of the first IF signal are then received by a field programmable gate array (FPGA) 705. FPGA 705 includes two channels with digital in-phase (I) and quadrature (Q) down-converters 706 and 707 and FFT processors 710 and 711. The frequencies of down-converters 706 and 707 are formed by direct digital synthesizers (DDS) 708 and 709, respectively. Down-converters 706 and 707 convert (separately) two selected dominant harmonics contained in the first IF signal (e.g., PLC channel 601) to an even lower second IF or baseband (few kHz; e.g., 2 kHz). At the second IF, FFT processors 710, 711 are able to calculate FFTs of the selected harmonics at a resolution of a few Hz. The calculated FFTs from FFT processors 710 and 711 are then captured by a signal analysis module or block 712, where the selected dominant harmonics are detected and their frequencies are measured. As mentioned previously, detection of the harmonics is accomplished by comparing the measured levels of the harmonics to a threshold, which is usually set 10-15 dB below the noise floor. If both harmonics are detected and the frequency offset between the harmonics (measured FOharm) is within a predetermined tolerance of the expected offset (nominal parameter, FOharm), then a decision is made in block 712 that the OFDM leakage signal has been detected (validation).

After a decision is made that the OFDM leakage signal has been detected, block 712 confirms measurements of signal level and determines Doppler shift of the harmonics. As discussed in greater detail below, the Doppler shift measurements are determined relative to the nominal frequencies of the harmonics (nominal parameter, Fharm). The nominal frequencies were previously stored in a programmable computer or digital controller (CPU) 713 and sent to block 712 for determining measured Doppler shift and measured frequency offset FOharm. The nominal frequencies (Fharm i) may originally be transmitted from central server 105 (FIG. 1) to CPU 713 via a wireless communications network, an antenna 715, and a wireless modem 714 (FIG. 7). Alternatively, a user (technician) can directly enter the nominal frequencies into CPU 713 via a user interface and input device (keyboard, touch screen, etc.). The process of down-converting the leakage signal and measuring Doppler shift is discussed further below. As shown in FIG. 7, leakage detector 700 also includes a GPS time sync module 716 with a GPS antenna 717. Module 716 provides a very stable GPS clock signal (e.g., 10 MHz or 10.24 MHz) to tuner 703, ADC 704 and FPGA 705. This clock allows the Doppler shift to be measured with an accuracy of within 1 Hz. Module 716 also sends to CPU 713 other GPS data associated with the leakage detection and Doppler shift measurements, such as timestamps, latitude/longitude coordinates, and speed of truck. This GPS data together with the results of leakage detection and Doppler shift are compiled in a report. CPU 713 sends the report, via wireless modem 714, to central server 105 on a periodic basis (e.g., every couple of seconds).

Figure 8:
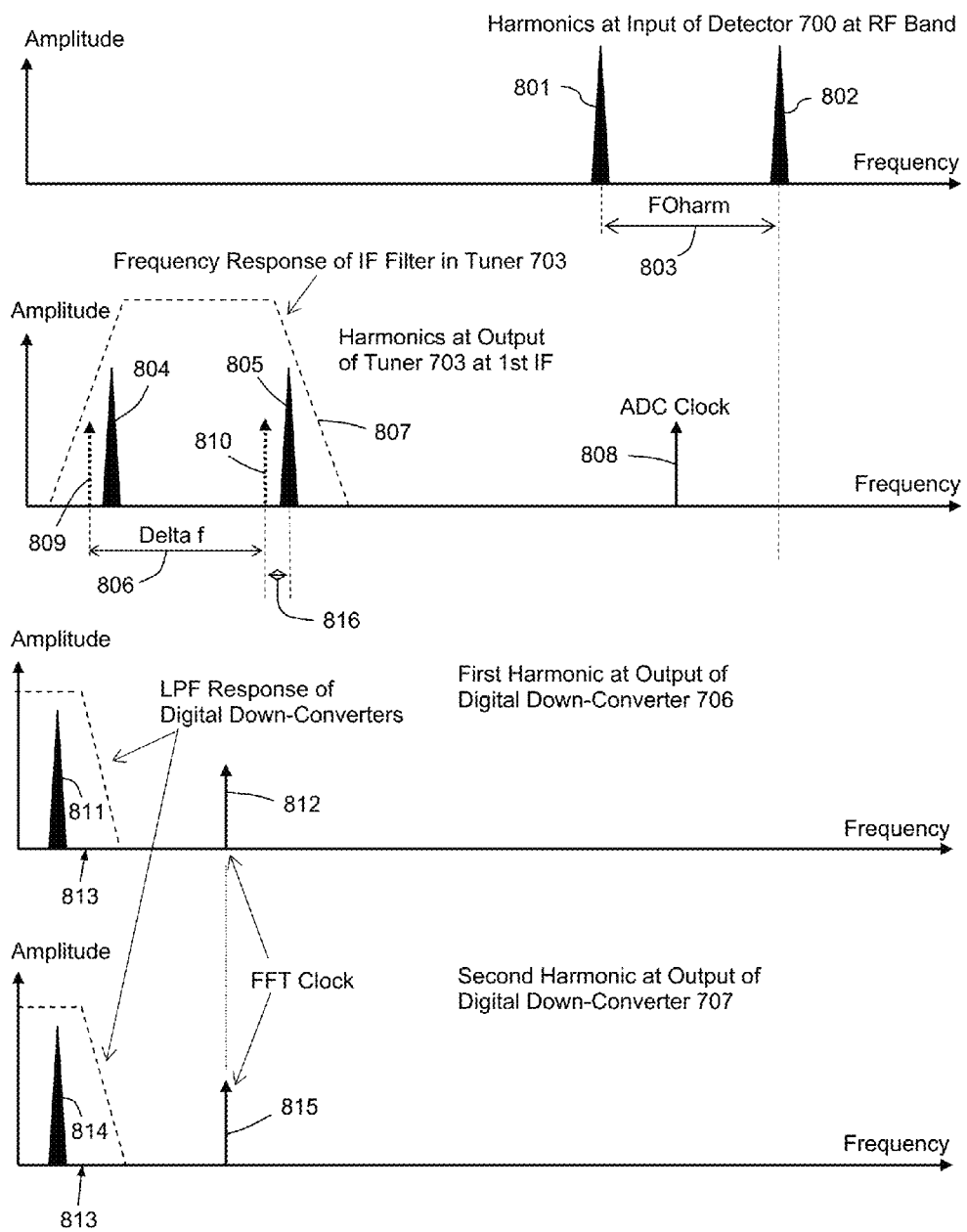
FIG. 8 is a series of frequency spectrum diagrams illustrating a pair of dominant harmonics belonging to a pair of OFDM pilots, respectively, and showing a first down-conversion of the harmonics from RF to IF and a second parallel down-conversion from IF to baseband.

Referring now to FIG. 8, the process of down-converting the RF OFDM leakage signal to the first IF signal and from the first IF signal to the second IF signal will now be described. FIG. 8 contains four schematically drawn spectrum graphs of amplitude versus frequency. An RF leakage signal contains a pair of dominant harmonics 801 and 802, separated by a frequency offset (FOharm) 803 (first graph). A part of the RF leakage signal containing harmonics 801, 802 (e.g., PLC channel 601) is selected and down-converted (e.g., in tuner 703) to a first IF with a bandwidth 807, and is referred to herein as a first IF signal (second graph). In this first down-conversion, harmonics 801 and 802 are converted to first IF harmonics 804 and 805, respectively. The frequency offset between harmonics 804 and 805 is theoretically the same as offset 803 at RF. The first IF signal is digitized (e.g., by ADC 704) using a clock signal 808 (second graph). If the IF of the first IF signal is, e.g., 5 MHz and bandwidth 807 is, e.g., 6 MHz, than clock signal 808 should have a frequency of 20 MHz (an integer scale factor of 2 of the 10 MHz GPS clock frequency).

The nominal frequencies of first IF harmonics 804 and 805 are known because the nominal frequencies of RF harmonics 801, 802 (Fharm i) are known and the frequency of tuner 703 is known. For example, if Fharm of harmonic 801 is 708.44 MHz and the tuner frequency is 711 MHz (e.g., center frequency of PLC channel 601), then 711 MHz is down-converted to first IF 5 MHz and 708.44 MHz is down-converted to 5−(711−708.44)=2.44 MHz. Thus, the nominal frequency of first IF harmonic 804 is 2.44 MHz. Certain nominal parameters associated with the RF harmonics (e.g., Fharm i) are predetermined and stored in CPU 713 of leakage detector 700. Based on the nominal frequency of first IF harmonic 804 (e.g., 2.44 MHz), DDS 708 (FIG. 7) forms I/Q signals 809 (shown as one signal) for down-converting (in down-converter 706) IF harmonic 804 to a second IF band 813 (third graph). The down-converted result is filtered by a low-pass filter (LPF), not shown but inherent in down-converter 706. DDS 709 (FIG. 7) forms I/Q signals 810 (shown as one signal) for down-converting (in down-converter 707) IF harmonic 805 to the same second IF band 813 (fourth graph). The down-converted result is filtered by a low-pass filter (LPF), not shown but inherent in down-converter 707. Note from the second graph in FIG. 8 that signal 810 is offset from signal 809 by a frequency offset 806. Offset 806 is preferably equal to the offset between nominal frequencies of harmonics 804 and 805. As a result, both harmonics 804 and 805 are down-converted to the same second IF frequency, to produce second IF harmonics 811 and 814. The nominal frequency of either second IF harmonic 811 or 814 is selected to be a few kHz (as mentioned above). For example, if the nominal frequency is 2 kHz, then DDS 708 will generate signals 809 at a frequency of 2.44−0.002=2.438 MHz, to place second IF harmonic 811 at 2 kHz (708.44 MHz to 2.44 MHz to 2 kHz). Similarly, DDS 709 will generate signals 810 at a frequency of [5+(711−708.44)]−0.002=7.558 MHz. The conversion to second IF band 813 is done to achieve good frequency resolution in FFT processors 710, 711.

In the second graph of FIG. 8, an offset 816 is the difference between the frequencies of harmonic 804 and signals 809 or the difference between the frequencies of harmonic 805 and signals 810. Offset 816 is equal to the second IF frequency (e.g., 2 kHz). It is preferred that offset 816 (or second IF) be as small as possible, but it must be more than half the possible frequency drift of second IF harmonic 811 or 814. The possible frequency drift includes the Doppler shift (probably up to 100 Hz) and any drift due to instability of the GPS time sync module (e.g., module 716 in FIG. 7). By making the second IF frequency only a few kHz, a relatively low clock rate can be used in FFT processors 710, 711. A clock signal 812 (FIG. 8, third graph) is used in FFT processor 710 and a clock signal 815 (FIG. 8, fourth graph) is used in FFT processor 711. The frequency of clock signals 812, 815 should be an integer divider of the GPS clock signal from module 716 (e.g., 10 MHz/512=19.53125 kHz). A clock frequency of 19.53125 kHz will provide about 1 Hz resolution for a preferred 16K FFT mode in FFT processors 710, 711.

As noted above, one of the main challenges of detection and location of leaks in an HFC network is multipath effects, occurring especially in urban areas. In applying the Doppler method to locating leaks in an HFC network, Doppler shift measurements should be accurate to within 1 Hz in order to overcome the adverse effects of multipath. In accordance with a preferred embodiment of the present invention, the impact of multipath effects are reduced by: (1) measuring Doppler shift at least at two different frequencies (e.g., two separated dominant harmonics); (2) measuring Doppler shift at different points along a drive route; and (3) averaging multiple Doppler shift measurements taken at a drive-route point, over a one-second time interval. The time interval is selected to be one second because that interval is compatible with currently existing leakage report databases. Also, a one-second interval is a reasonable compromise between measurement accuracy and system speed or response time.

Figure 9:
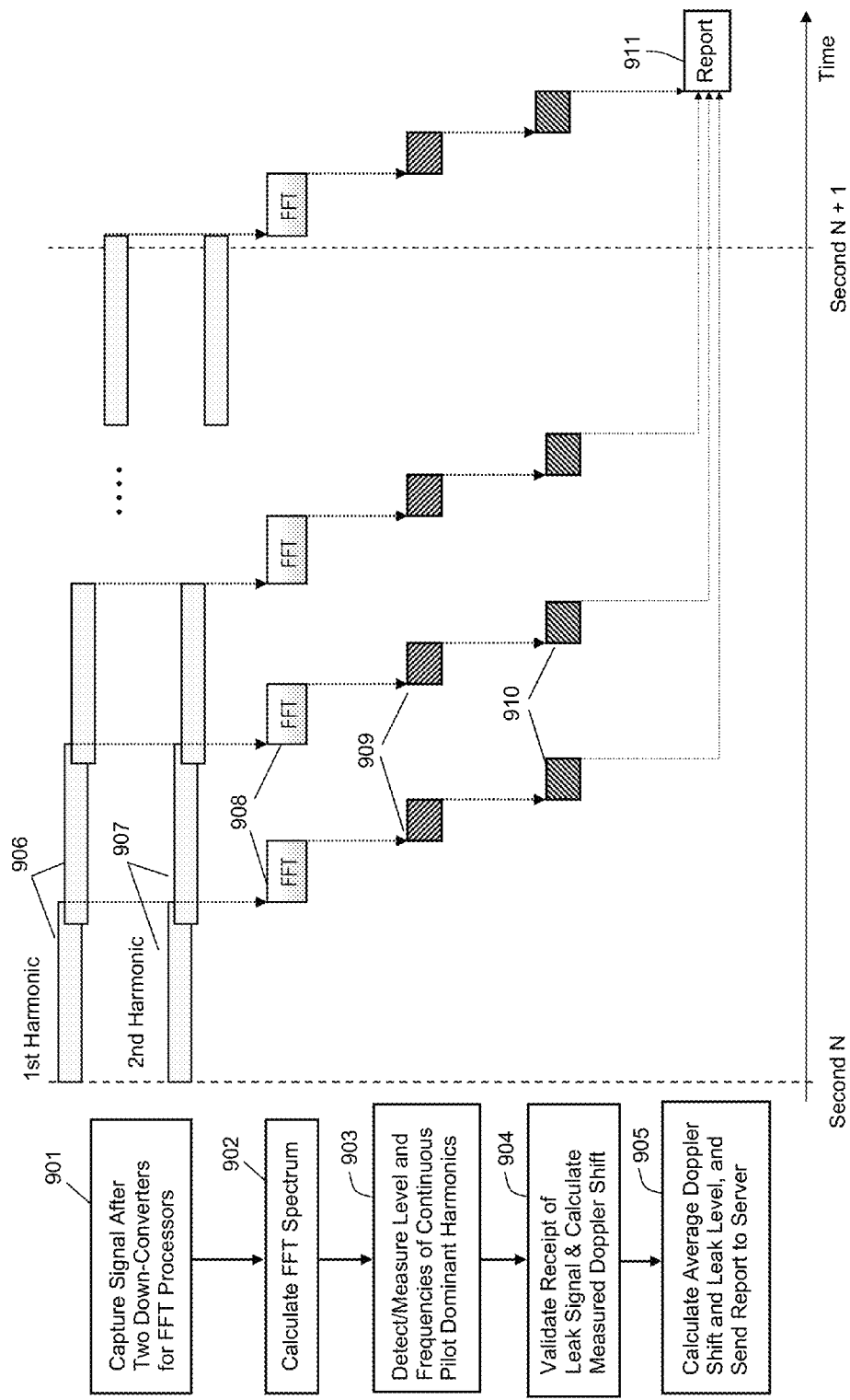
FIG. 9 is an illustrated flow diagram outlining a preferred method of the present invention, comprising the steps of capturing baseband harmonics of the pilots, calculating their frequency spectrums, detecting and measuring frequencies of the harmonics, validating that the harmonics are from the OFDM leakage signal and calculating Doppler shift, calculating averaged Doppler shift (to minimize multipath effects), and sending a report to a central server.

Referring now to FIG. 9, an illustrated flow diagram is shown to aid in describing the processing in FFT processors 710, 711 and in signal analysis block 712. In a first step 901, the second IF signals 811 and 814 are captured at FFT processors 710 and 711, respectively. In order to maximize the number of Doppler shift measurements taken within a one-second time interval, successive sets of samples of signals 811 and 814 (e.g., sets 906 & 907 in FIG. 9) are captured with some overlap in time (FIG. 9). This overlap is accomplished by buffering in processors 710, 711 (using, e.g., a FIFO memory configuration). The captured sets of samples of signals 811 and 814 are shown in FIG. 9 as sets 906 and 907, respectively. The duration of captured sample sets 906, 907 is determined based on the sensitivity required for detection of the dominant harmonics and on the accuracy required for measuring Doppler shift. As noted, the duration of the captured dominant harmonic signal (time-domain samples 906 & 907) should be about 100 ms in order to detect an OFDM leakage signal with a sensitivity of 1 µV/m (at LTE frequencies).

In a second step 902 (FIG. 9), the FFT spectrums of the captured time-domain sample sets 906, 907 are calculated during time intervals 908 (in FFT processors 710, 711, respectively, in parallel). In a third step 903, dominant harmonics 811, 814 are detected and the signal strength of each harmonic is measured. The harmonics are detected, for example, by comparing the measured signal strength levels of the harmonics to a threshold, which is preferably set about 10-15 dB below the noise floor. The measured levels of the harmonics are saved in CPU 713 for later calculation of the OFDM Leak Level, according to equation (3) above. In addition, the frequencies of harmonics 811, 814 are measured in step 903. An explanation of how the frequencies are measured is now given, using as an example a nominal frequency of 708.44 MHz for harmonic 801. The sampling rate of FFT processor 710 is 10 MHz/1024=9.765625 kHz and the FFT mode is 16K points (also for FFT processor 711). The second IF frequency=2 kHz, which is the nominal frequency of harmonic 811. The 2 kHz frequency corresponds to FFT point 3355 (2 kHz/(9,765,625/16384 points)). So, if the measured peak of the FFT spectrum from processor 710 is at point 3355, that means the harmonic is actually at the nominal frequency of 2 kHz and the corresponding RF frequency for corresponding harmonic 801 is 708.44 MHz. However, if the peak is actually detected at point 3455 (100 points above nominal point) in processor 710, then the measured frequency at second IF is 2 kHz+(100 points×(9,765.625/16384))=2+59.605=2,059.605 kHz, and the measured RF frequency of harmonic 801 is 708.44 MHz+59.605 Hz=708.440059.605 MHz. Thus, based on the spectrums of FFT processors 710, 711, the measured frequencies of the RF harmonics are determined. Step 903 is performed in block 712 or CPU 713. Harmonic detection and frequency measurement in step 903 occur during time intervals 909.

In a fourth step 904 (FIG. 9), a validation process (as described above) is performed to confirm that an OFDM leakage signal from the HFC network under test has been detected. The validation process includes determining a measured frequency offset between harmonics 801 and 802 ("measured offset 803") based on the measured frequencies of second IF harmonics 811 and 814 (as just discussed for step 903). Measured offset 803 is then compared to the nominal frequency offset (FOharm) between the nominal frequencies (Fharm i) of harmonics 801 and 802 (nominal parameters stored in CPU 713). If measured offset 803 is close to (e.g., within a few Hz of) the nominal frequency offset FOharm, then a decision is made in block 712 (or CPU 713) that the true selected dominant harmonics have been detected and are part of an actual OFDM leakage signal from the HFC network. In one embodiment, measured offset 803 is determined by taking the measured RF frequency of harmonic 801 and subtracting it from the measured RF frequency of harmonic 802. For example, the nominal frequency offset FOharm is 5.12 MHz, and the measured frequencies of harmonics 801 and 802 are 708.440059.605 MHz (from above example) and 713.560060.505 MHz, respectively. Therefore, measured offset 803 is 713.560060.505−708.440059.605=5.120000.9 MHz, and since measured offset 803 is within a few Hz of nominal FOharm (within 0.9 Hz), detection of harmonics 801, 802 is validated. Alternatively, and in a similar manner, measured offset 803 can be determined from the nominal frequencies of first IF harmonics 804, 805. It is noted again that the drifts (Doppler shift and clock instability of detector) associated with each measured frequency of the harmonics do not substantially affect the determination of measured offset 803, because the drifts substantially cancel out in computing the offset (e.g., Doppler shifts should cancel out to within less than 1 Hz).

The measured Doppler shift is also determined in step 904. In the present embodiment, the measured Doppler shift is determined relative to the nominal frequency of the dominant harmonics. The measured Doppler shift is the difference between the measured frequency of the harmonic and the nominal frequency of the harmonic. In the example given above regarding frequency measurement, the measured frequency of harmonic 811 was 100 FFT points above nominal, which worked out to be 59.605 Hz above the nominal frequency of harmonic 811. Thus, in the present embodiment, the measured Doppler shift for harmonic 811 (and harmonic 801) is considered to be 59.605 Hz. The measured Doppler shift of harmonic 814 (and harmonic 802) is also determined in this manner. Validation and Doppler shift measurement are performed in step 904 during time intervals 910.

In a final step 905 (FIG. 9), an averaged Doppler shift is calculated from the measured Doppler shifts determined during the several intervals 910. Ideally, ten intervals 910 collectively extend over a one-second interval. A measured Doppler shift value is produced for each dominant harmonic, in each interval 910. Therefore, 20 measured Doppler shift values (10 for each harmonic) are produced for each one-second interval. All 20 Doppler shift values are averaged together in CPU 713 to produce the averaged Doppler shift. Also, the harmonic levels measured in step 903 (and confirmed in step 904) yield 10 level measurements for each harmonic over the one-second interval. In step 905, the 10 level measurements of each harmonic are averaged together in CPU 713 to produce an averaged harmonic level for each harmonic. As indicated in FIG. 9, the averaged Doppler shift and averaged harmonic levels are calculated during a time interval 911. Also, during interval 911, the Leak Level of the OFDM leakage signal is calculated in CPU 713 using equation (3) above. In the preferred embodiment, equation (3) is used to calculate a Leak Level from the averaged harmonic level of each harmonic, thus yielding two calculated Leak Levels. The two Leak Levels are then averaged together to create a Leak Level for the particular one-second interval (also representing one drive-route point). Thus, one Leak Level is produced for every one-second time interval. In an alternative approach, the Leak Level may simply be calculated from the averaged level of one or the other of the dominant harmonics. In a further alternative approach, the Leak Level may be calculated from a global average of both sets level measurements (i.e., 20 measurements) and the RLharm's of both harmonics are averaged together to create an averaged RLharm, and these averaged values are plugged into equation (3).

At the completion of the one-second time interval, and during interval 911, CPU 713 prepares and sends a report to central server 105. The report includes the averaged Doppler shift, Leak Level, timestamp (second, min, day), latitude/longitude coordinates, and speed of truck. Note that each one-second time interval (e.g., from Second N to Second N+1 in FIG. 9) yields an averaged measured Doppler shift value and a Leak Level value for one drive-route point. Thus, in the preferred embodiment, each one-second interval represents one drive-route point. Also note that at least one set of latitude and longitude coordinates are sent as part of the report at the completion of the one-second time interval. In the preferred case, where one set of coordinates are sent, the coordinates are preferably recorded at the mid-point of the one-second time interval (half-second point). However, in other embodiments multiple sets of coordinates may be recorded and reported; for example, based on currently available GPS sync modules, coordinates can be recorded every five milliseconds or 20 times per second. Further note that, in an alternative embodiment, the measured harmonic levels (e.g., 10 for each harmonic) and measured received frequencies (e.g., 10 measurements for each harmonic) of the harmonics, for each one-second interval, are sent directly to central server 105, where the harmonic levels are averaged and the Leak Level is calculated and where measured Doppler shifts are calculated and then averaged as described above.

Figure 10:
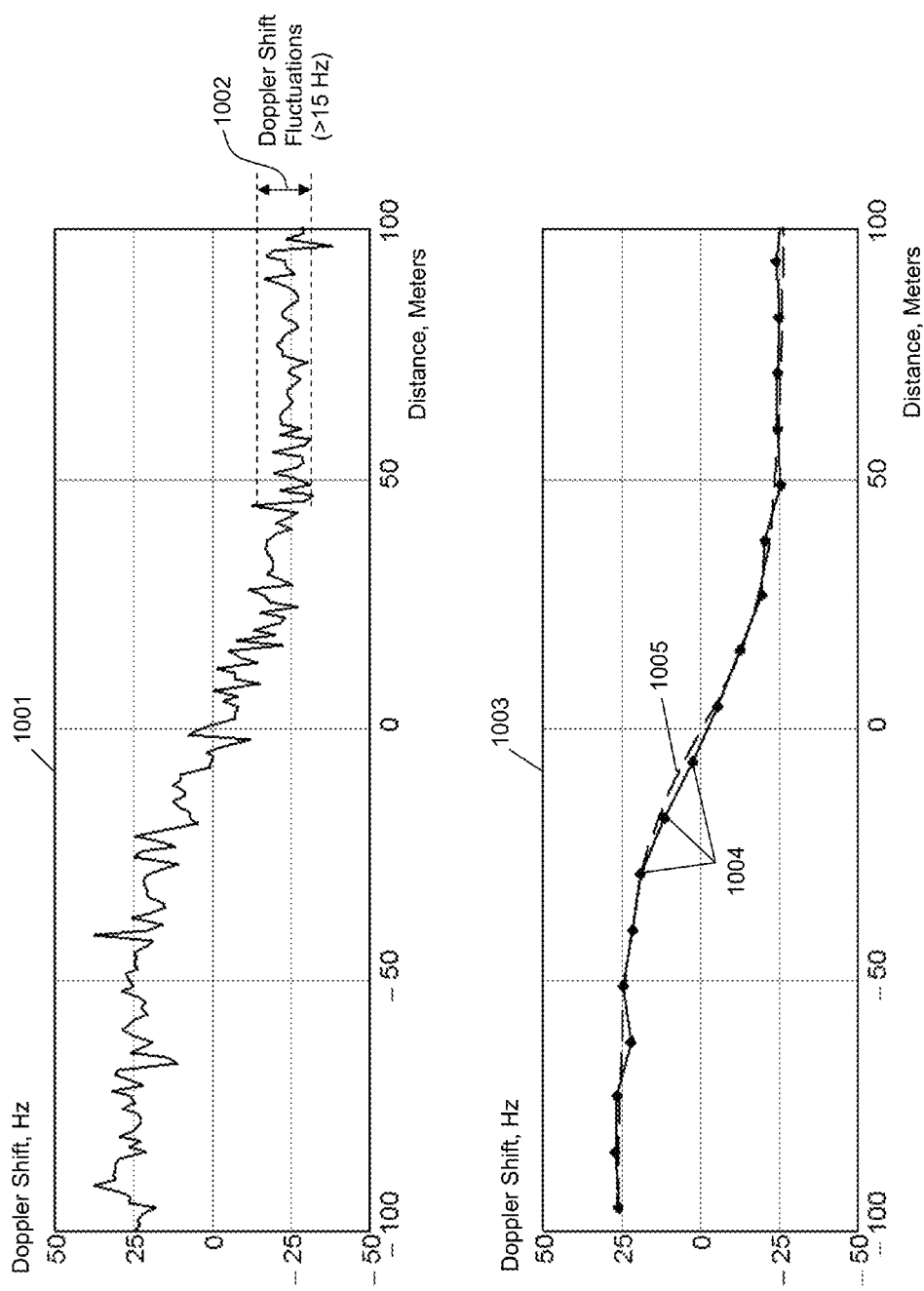
FIG. 10 is a pair of Doppler shift curves versus distance, illustrating how averaging of measured Doppler shift values can minimize the effects of multipath, where the top curve is a plot of un-averaged values and the bottom curve is a plot of averaged values.

By averaging the measured Doppler shifts, taken over a one-second interval and at two different harmonic frequencies, a significant reduction in measurement error or fluctuations (e.g., due to multipath effects) is achieved. This is illustrated in FIG. 10, showing an upper graph 1001 and a lower graph 1003. Both graphs 1001 and 1003 contain plots of Doppler shift (in Hz) versus distance (in meters) going toward and away from a leakage source. Graph 1001 shows emulation results of measured Doppler shift (un-averaged) of a leakage signal at a truck speed of 40 km/h, in the scenario of FIG. 1 and in an environment of random multipath reflections of the leakage signal. The measured Doppler shift contains fluctuations 1002 caused by the multipath. As indicated, fluctuations 1002 are 15 Hz or greater. This is a severe case considering that the maximum Doppler shift at this truck speed is only 25 Hz (see FIG. 1). Graph 1003 shows a plot of averaged Doppler shift data at multiple drive-route points 1004. Each data point 1004 is the result of averaging 20 measured Doppler shift values during a one-second (travel) interval (i.e., 10 measurements×2 harmonics). A curve 1005 is the ideal case (no multipath) for the measured Doppler shift. The curve that fits points 1004 has minimal fluctuation and is very close to the ideal curve 1005. In comparing graphs 1001 and 1003, the results of averaging are dramatic.

Figure 11:
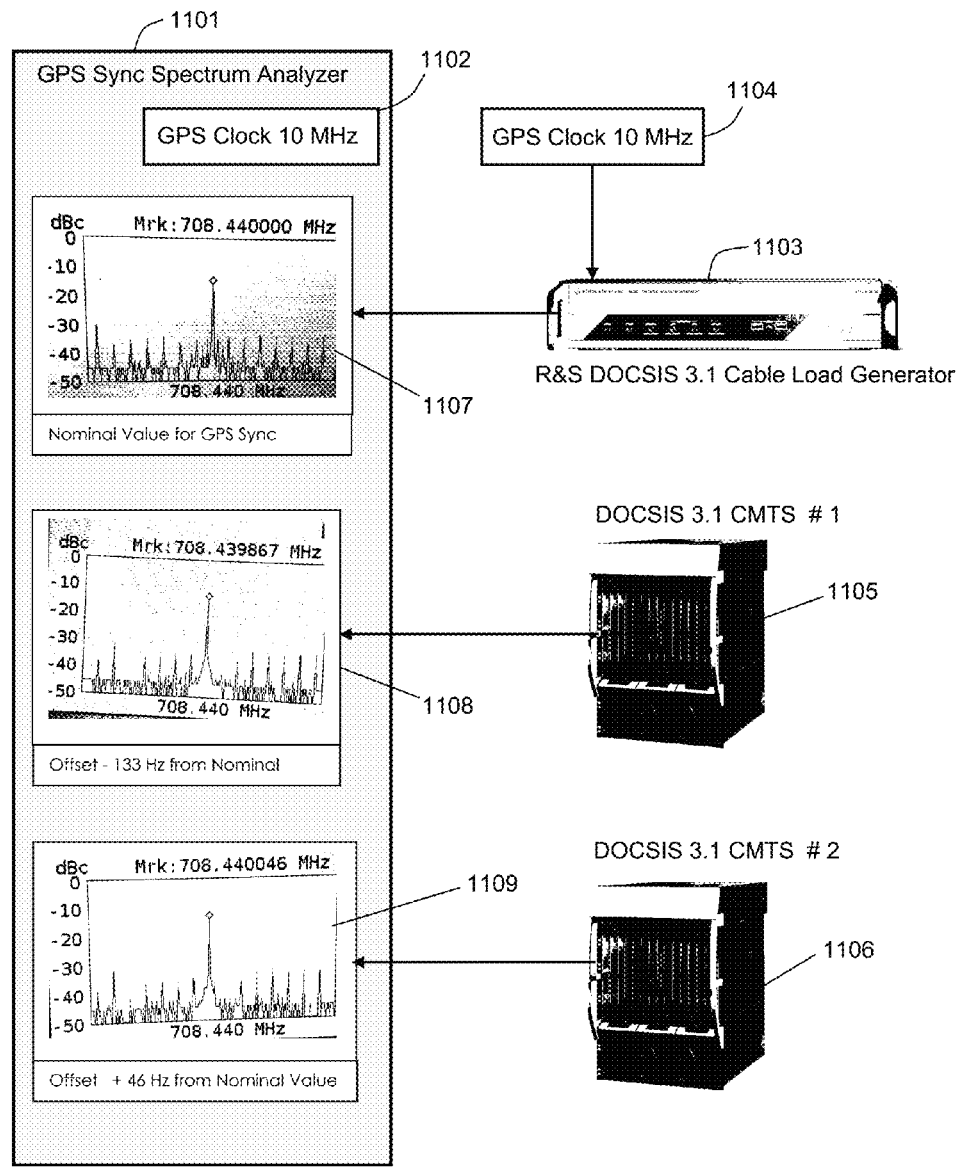
FIG. 11 is a diagram illustrating the problem with CMTS's in an HFC network, producing unique (random) frequency offsets or errors (FEcmts) from the nominal (or specified) center frequency (708.44 MHz), due to limited accuracy of the master clock in each CMTS.

As noted previously, one problem with using the Doppler method in an HFC network is that the frequency accuracy of the master clock on the CMTS card is limited. The frequency error may be greater than the maximum Doppler shift expected on a drive route. This problem was confirmed in actual tests. FIG. 11 helps illustrate the problem. An FFT spectrum analyzer 1101 was used to measure the frequency of a dominant harmonic in an OFDM signal. Analyzer 1101 is part of a field leakage detector called the Navigator Plus, supplied by ARCOM DIGITAL, LLC, Syracuse, N.Y. (www.arcomdigital.com). Analyzer 1101 has a GPS time sync module with a very accurate 10 MHz GPS synchronous clock 1102. A very stable signal generator 1103 was used to generate the OFDM signal for direct input to spectrum analyzer 1101. Generator 1103 is a DOCSIS 3.1 Cable Load (Multichannel Signal) Generator from Rohde & Schwarz GmbH & Co. Munich, Germany. See Rohde & Schwarz data sheet at https://cdn.rohde-schwarz.com/pws/dl_downloads/dl_common_library/dl_brochures_and_datasheets/pdf_1/CLGD_bro_en_3607-0123-12_v0200.pdf. As shown in FIG. 11, generator 1103 is synchronized to a 10 MHz external GPS clock 1104. Generator 1103 formed an OFDM signal with the following parameters: 4K FFT mode; cyclic prefix duration of 5 µs; 708 MHz center frequency of the OFDM signal; and PLC location is 2104 (index # of first PLC subcarrier). The dominant harmonic of an outermost pilot in the 6 MHz PLC channel (like pilot 608 in FIG. 6) was selected for frequency measurement. The pilot is located at subcarrier index number 2057. The center frequency of the pilot at subcarrier number 2057 is:

$$f\text{pilot}=708\text{ MHz }(DC\text{ subcarrier at }2048)+50\text{ kHz} \times (2057-2048)=708.450000\text{ MHz}$$

The dominant harmonic of this pilot was calculated to be 10 kHz below the pilot's center frequency, using previously defined equation (2). So, the nominal (calculated, theoretical or expected) frequency of the dominant harmonic should be 708.450−0.010=708.440 MHz. The exact same harmonic frequency of 708.440 MHz was measured by FFT spectrum analyzer 1101 from the OFDM signal generated by generator 1103. An FFT spectrum response 1107 from analyzer 1101 shows the measured harmonic frequency to be 708.440 MHz.

Continuing with the test in FIG. 11, the frequency of the same dominant harmonic was measured in the field from OFDM signals generated by two different DOCSIS 3.1 CMTS's 1105 and 1106. The OFDM signals from CMTS's 1105 and 1106 had the exact same parameters as the OFDM signal from generator 1103. With CMTS 1105, the measured frequency of the dominant harmonic was 708.439867 MHz, as indicated by an FFT spectrum response 1108. The frequency offset (or error FEcmts) from the nominal value (708.440 MHz) is −133 Hz. With CMTS 1106, the measured frequency of the dominant harmonic was 708.440046 MHz, representing an offset (FEcmts) of +46 Hz, as indicated in a response 1109. The accuracy of the master clock in CMTS 1105 is 133/708,440,000=187 PPB, which is within the limits specified under DOCSIS 3.1. Thus, it can be expected that the frequency errors (FEcmts) of CMTS's 1105 and 1106 will be experienced in a DOCSIS 3.1 compliant HFC network. But, an offset (FEcmts) of 133 Hz is more than five times greater than the maximum Doppler shift expected in the drive route scenario of FIG. 1 (assuming a truck speed of 40 km/h). The offsets (e.g., 113 Hz and 46 Hz) are random from CMTS to CMTS. This is a significant obstacle in applying the Doppler method to leak location in an HFC network.

Figure 12:
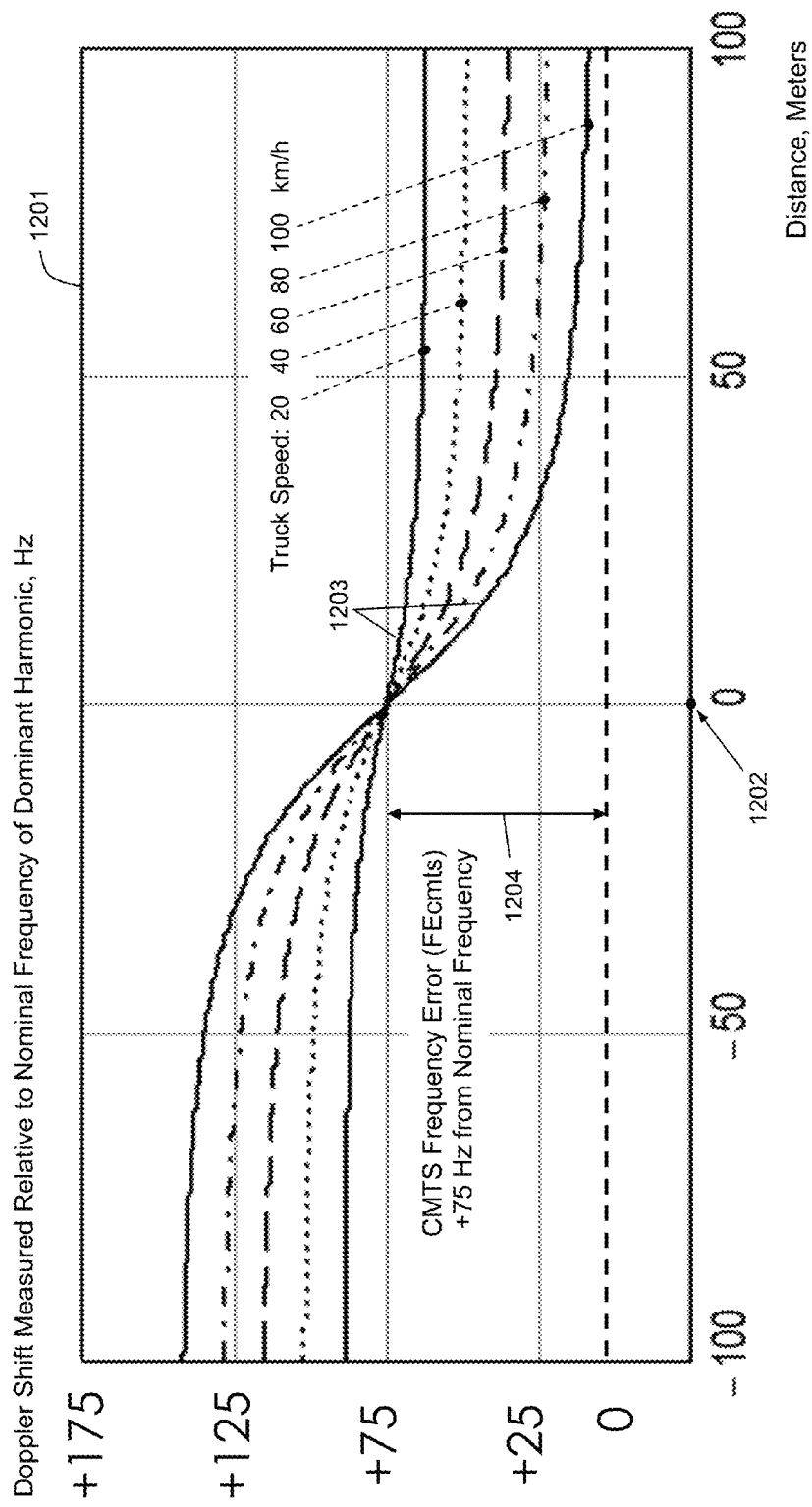
FIG. 12 is a series of curves (different truck speeds) of measured Doppler shift versus distance (measured relative to nominal frequency of dominant harmonic), showing a frequency error (FEcmts) of +75 Hz caused by the CMTS master clock.

Referring now to FIG. 12, a graph 1201 plots measured Doppler shift (in Hz) of a dominant harmonic (measured relative to the nominal frequency of the dominant harmonic) versus distance (in meters) to and from a point 1202 of "zero" Doppler shift (i.e., the source of the leaked dominant harmonic). Graph 1201 contains Doppler shift curves 1203 for five truck speeds (20, 40, 60, 80 and 100 km/h). Curves 1203 are similar to curves 112 in FIG. 1, except that curves 1203 represent Doppler shift relative to the nominal frequency of the dominant harmonic. The Doppler shift values in curves 1203 contain a frequency error (FEcmts) 1204 caused by the CMTS clock. Again, the error is determined relative to the nominal frequency. There may also be a minimal drift from the leakage detector clock; however, as previously noted, such drift is very small (<1 Hz) and thus is not represented in curves 1203. In comparing FIG. 12 with FIG. 1, curves 1203 are shifted upward (from actual zero Doppler) by 75 Hz. The zero Doppler shift point in FIG. 1 registers as a +75 Hz Doppler shift in FIG. 12 (i.e., "zero" Doppler shift point 1202). As mentioned, the CMTS frequency error presents an obstacle in applying the Doppler method to leak location in an HFC network.

A preferred embodiment of the present invention offers solutions to overcoming this obstacle. In the embodiments described herein, Doppler shift is measured relative to the nominal frequency of the dominant harmonic (because the actual transmit frequency of the dominant harmonic is a priori unknown). Leakage detector 700 transmits reports to central server 105 with data of Doppler shift measured relative to the nominal harmonic frequency ("measured Doppler shift"). Then, at central server 105, a "zero" measured Doppler shift value is determined, which is only the error FEcmts contribution (e.g., +75 Hz) to the offset from the nominal frequency (i.e., zero contribution from Doppler shift). The quotation marks around zero in "zero" measured Doppler shift" refer to the fact that the value is measured relative to the nominal frequency and thus is usually not zero. In the following discussion and claims, the quotation marks are dropped, the meaning now being clear. Also, in the following discussion, zero measured Doppler shift is referred to by the symbol F0, rather than FEcmts. Once F0 is determined, actual Doppler shift values are calculated from the measured Doppler shift values (i.e., Actual=Measured−F0). F0 is determined using at least one estimation algorithm (but preferably two different algorithms in combination).

Figure 13:
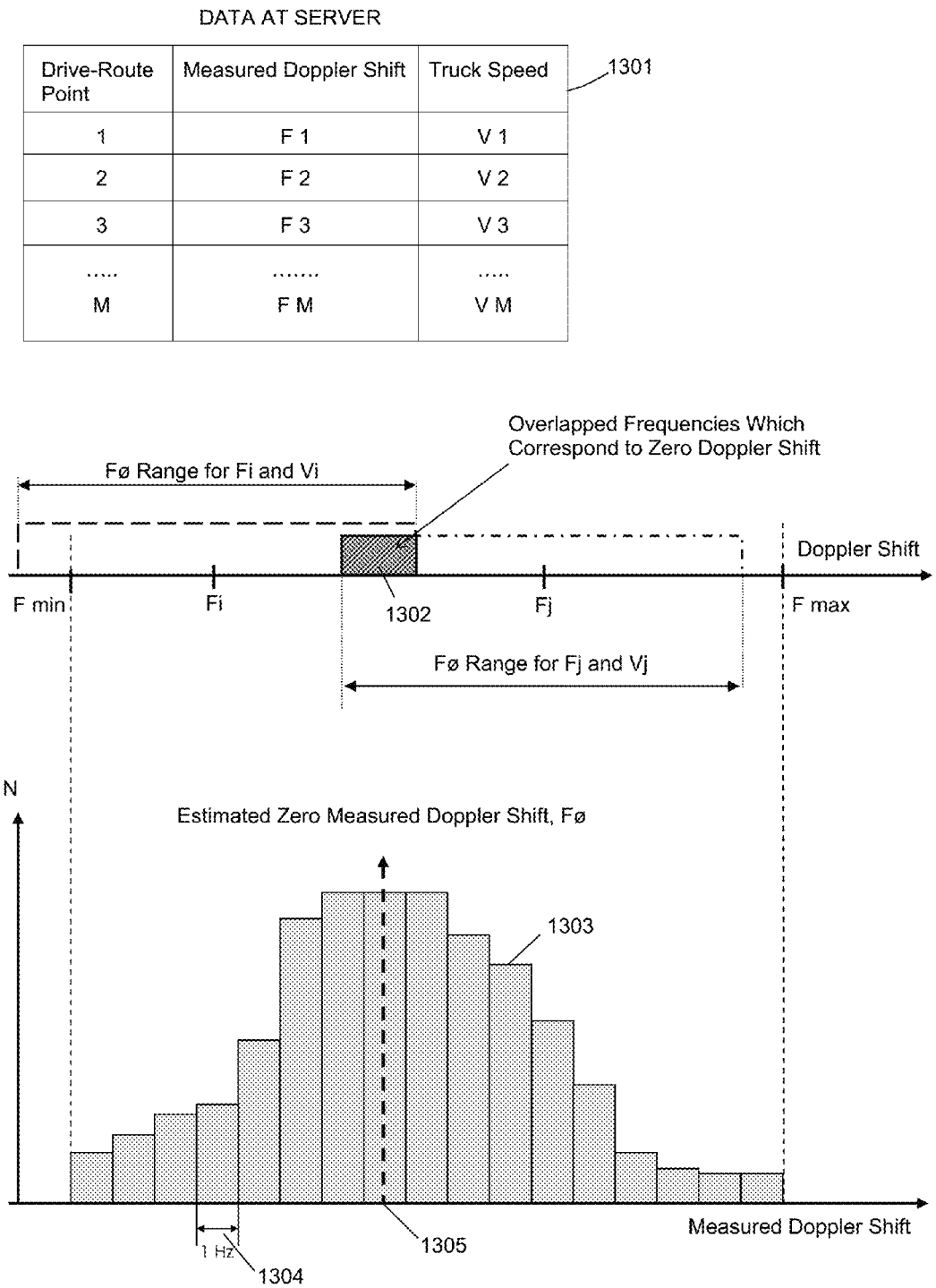
FIG. 13 illustrates a method (static algorithm) of estimating a "zero" Doppler shift value from a distribution function (histogram) produced from a number of ranges of measured Doppler shift values (relative to nominal frequency), and showing a data table (top) at a central server containing data of drive-route point numbers, measured Doppler shift values, and truck speed.

The first estimation algorithm is illustrated in FIG. 13, and is referred to herein as the "static algorithm." Data concerning measured Doppler shift, received at central server 105 (from leakage detector 700), is represented in a table 1301. The data is organized in M (m=1→M) data sets, where each set includes: a drive-route point m (with associated set of latitude/longitude coordinates); measured Doppler shift at point m (Fm); and truck speed at point m (Vm). The data used to estimate F0 in the static algorithm should be collected on one day, to avoid day-to-day variations. Thus, table 1301 may contain data for one particular day. The data of table 1301 concerns detected leaks over the entire node or group of nodes serviced by a single CMTS. Thus, table 1301 is not limited to measurements from one leak. Measurements from all leaks in the node or group of nodes can be used in the estimation. This works because all leaks in a commonly served node or nodes emit the same signal (e.g., OFDM signal) from the same signal source (CMTS). So, it does not matter if the signal is received from a single leak or from different leaks at different parts of the node. In the static algorithm, the purpose is not to isolate or locate a particular leak, but to simply estimate a "zero" measured Doppler shift value (F0) from the measured Doppler shift data (as reflected in histogram 1303). As mentioned, latitude/longitude coordinates are associated with each drive-route point m, and the geographic boundaries of each node are known in server 105; thus, server 105 is able to identify which points are located within which nodes. An example of a server equipped with geographic boundaries of nodes for many HFC networks, and suitable for implementing the static algorithm, is the QAM Snare® Leakage Server, supplied by ARCOM DIGITAL, LLC, Syracuse, N.Y. (www.arcomdigital.com).

Referring again to table 1301, each drive-route point m has an associated measured Doppler shift value Fm and truck speed Vm. Keep in mind that the measured Doppler shift Fm is measured relative to the nominal frequency of the dominant harmonic. Thus, Fm includes the actual Doppler shift FAm (at point m and truck speed Vm) and the frequency error of the CMTS FEcmts (i.e., Fm=FAm+FEcmts). FEcmts is constant for all points m. If the actual Doppler shift FAm is zero at point m, then the measured Doppler shift value (Fm) is equal to the CMTS frequency error (FEcmts), which, again, is the zero measured Doppler shift value F0. Now consider that a range of F0 values are possible for a given measured Doppler shift value Fm, and that the size of the range is defined by the truck speed Vm associated with Fm. This is understood from FIG. 1, where you see different ranges of Doppler shift values (from positive to negative) for different truck speeds. The range of possible F0 values is derived by considering Fm to be the value at the outer distance of a Doppler shift curve (defined by Vm) on the upper (or positive) end, and then moving from the upper end to the middle of the curve (i.e., the zero Doppler shift point). The process is then repeated by considering Fm to be the value at the outer distance of the Doppler shift curve on the lower (or negative) end, and then moving to the middle of the curve. For example, assume Fm=100 Hz, and if Vm=20 km/h, the Doppler shift curve varies over +/−15 Hz (f=708.44 MHz). If Fm is assumed to be at the upper or "positive" end of the curve, then moving to the zero point would decrease the value to 100−15=85 Hz (minimum F0); and if Fm is assumed to be at the lower or "negative" end of the curve, then moving toward the zero point would increase the value to 100+15=115 Hz (maximum F0). Thus, the range of possible F0 values is 85-115 Hz, for Fm=100 and Vm=20 km/h. Two such F0 ranges are shown for (Fi, Vi) and (Fj, Vj) in FIG. 13.

An equation to assist in calculating the F0 ranges is given as follows:

$$\Delta Fm = \pm Vm \times (f/c), \text{ where}$$

Vm is truck speed at point "m";
f is nominal frequency of the dominant harmonic (either harmonic, if two); and
c is the speed of light.

For example, if f=708.44 MHz and Vi=40 km/h at point (i), then Delta Fi=±26 Hz. Now, if the measured Doppler shift at point (i) is Fi=55 Hz, then the F0 range is (55-26)=29 Hz to (55+26)=81 Hz (or 29-81 Hz). At another point (j), if f=708.44 MHz and Vj=30 km/h, then Delta Fj=±20 Hz. If the measured Doppler shift is Fj=90 Hz at point (j), then the F0 range is (90-20)=70 Hz to (90+20)=110 Hz (or 70-110 Hz). Both F0 ranges are diagrammed in FIG. 13.

As shown in FIG. 13, an overlap of the two F0 ranges occurs at frequencies 1302. Overlap frequencies 1302 represent an area of common values for two different truck speeds, which suggests that the area contains the zero measured Doppler shift value F0. Now, if F0 ranges are calculated for all points m in table 1301, and the frequency of occurrence of the values from all these ranges is compiled, a probability distribution function or histogram 1303 can be constructed. From histogram 1303, a more accurate estimate of FØ (i.e., Fm=FEcmts) can be made for the data in table 1301. Histogram 1303 is divided into 1 Hz frequency steps or bins 1304, and at each 1 Hz bin the total number N of FØ ranges containing the frequency of the bin is given. In histogram 1303, the frequency bins with the largest total for N are the frequencies where FØ is most likely located. A most probable value 1305 for FØ is selected from histogram 1303 based on any well-known technique, such as center of gravity. In the special case where the truck has stopped (Vm=0) and the leak is detected (and frequency measured) during some time interval, only one or two bins 1304 of histogram 1303 will have compiled a number N.

An advantage of the static algorithm is that all drive-route points where leaks are detected within a node (or commonly-served nodes) can be used in the estimation of FØ. And, if the truck can reduce its speed or stop near a leak, then the accuracy of estimation will improve. In fact, an alternative to the static algorithm is to simply take one or more (e.g., a statistically adequate sample of) measurements of Doppler shift within each node (or group of commonly-served nodes) while the truck is stopped. In this alternative approach, the measured Doppler shifts, or an average of them, should produce a good estimate of FØ. In either approach (static algorithm or alternative), FØ is used to determine an actual Doppler shift value (FAm) at each point m, using the equation: FAm=Fm−FØ. Also, after FØ is estimated by either approach, it is used to search the M drive-route points for a point or points having a measured Doppler shift value equal to FØ. Thus, the static algorithm also yields one or more drive-route points (e.g., point C in FIG. 1) considered to be zero Doppler shift points.

Figure 14:
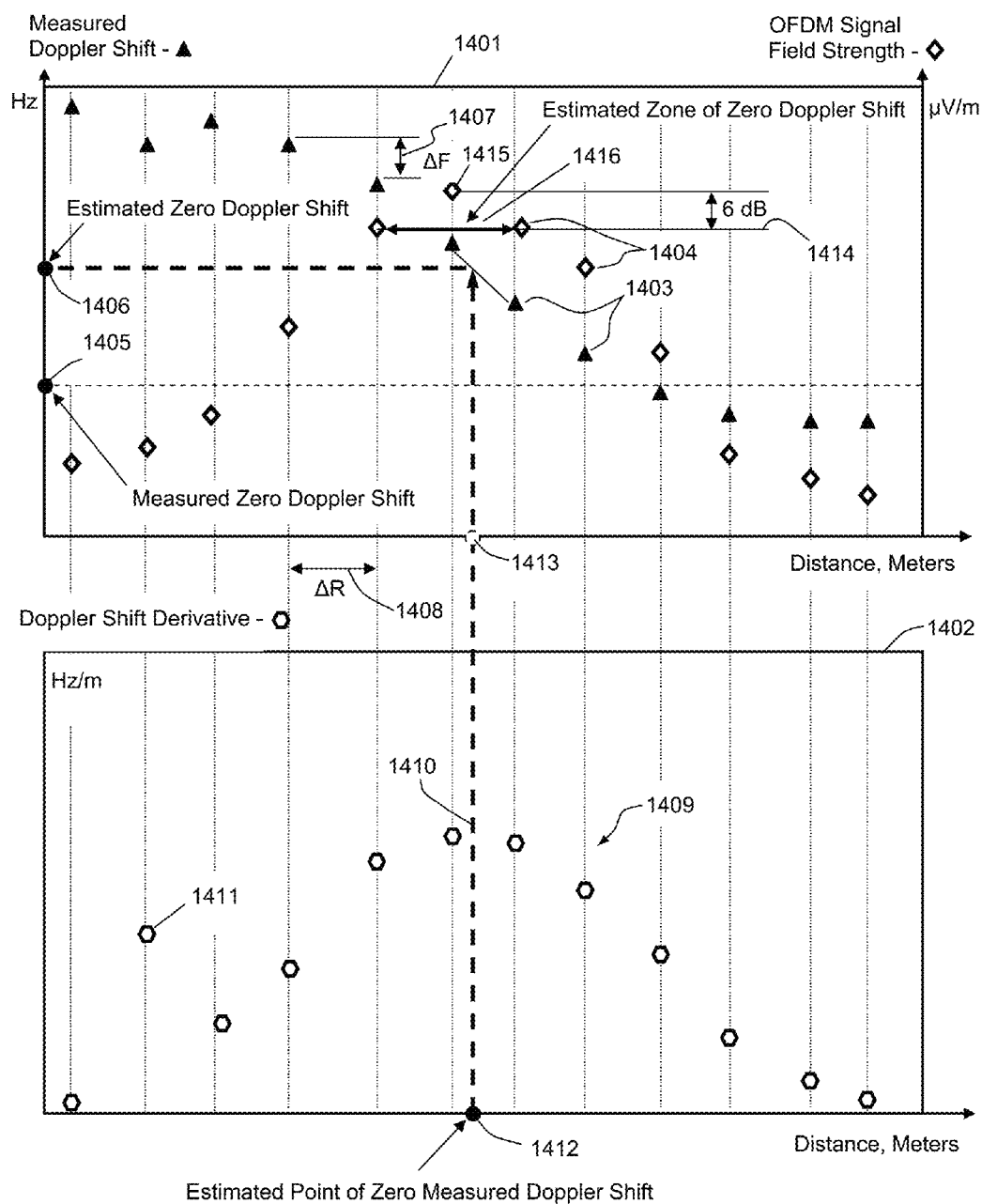
FIG. 14 illustrates a method (dynamic and modified dynamic algorithms) of estimating a "zero" Doppler shift value and a "zero" Doppler shift point from a derivative function of measured Doppler shift values (relative to nominal frequency)

A second method of estimating FØ (to ultimately calculate actual Doppler shift) is based on a change in measured Doppler shift as the truck moves from one drive-route point to another, toward and away from a signal leak ("dynamic algorithm"). Unlike the static algorithm, the dynamic algorithm works with data from one leak at a time. This method is illustrated in FIG. 14. FIG. 14 contains an upper graph 1401 and a lower graph 1402. Graph 1401 contains a measured Doppler shift curve 1403 and a leak level curve 1404. The leak levels in curve 1404 are calculated field strength of the detected OFDM leakage signal, in units of μV/m. Each data point of curves 1403 and 1404 represents a drive-route point where level and frequency measurements were taken by a truck traveling along a drive route. Each point also represents a one-second time interval over which multiple measurements are taken for that point. As a reference, FØ is measured independently of the dynamic algorithm, using GPS sync spectrum analyzer 1101 and the procedure described in connection with FIG. 11. This independently measured FØ is plotted on graph 1401 as a reference value 1405. Value 1405 is compared to an estimated FØ, which is the end result of the dynamic algorithm and plotted on graph 1401 as an estimated or extrapolated value 1406.

According to the dynamic algorithm, FØ is estimated by first calculating the derivative of the measured Doppler shift Fm, using the formula:

$$Dm = dFm/dRm, \text{ where}$$

dFm is change in measured Doppler shift 1407 at point m relative to previous point "m−1";

dRm is incremental distance 1408 between point m and previous point "m−1" along drive route.

Graph 1402 contains a curve 1409 representing a derivative function corresponding to the above formula. Curve 1409 is in units of Hz/meter versus distance in meters along a drive route. Curve 1409 contains a maximum 1410 representing a maximum change in Doppler shift and the point where the Doppler shift changes from a positive to a negative value. Maximum 1410 occurs in curve 1409 at a distance coordinate 1412—a physical point or position along the drive route where there is zero Doppler shift. Thus, coordinate 1412 serves as the estimated point along the drive route where FØ occurs. In accordance with the dynamic algorithm, the coordinate or point 1412 is projected to a coordinate or point 1413 on the distance (or drive route) axis of graph 1401. Using the measured Doppler shift curve 1403 (or a function representing curve 1403), an estimated or extrapolated measured Doppler shift value 1406 is obtained (graph 1401). The estimated or extrapolated value 1406 is selected as an estimate of FØ. The estimated FØ is then used to determine an actual Doppler shift (FAm) at each drive-route point "m" using the equation: FAm=Fi−FØ. The dynamic algorithm is preferably carried out in a central server, such as server 105.

Derivative function curve 1409 (lower graph 1402) may contain some false maximums caused by errors in measuring Doppler shift due to low signal strength levels of the dominant harmonics. An example of a false maximum is shown on graph 1402 at a point 1411. False maximums can be minimized or excluded from curve 1409 by removing all measured Doppler shift points in curve 1403 associated with leak levels (e.g., field strength levels) not meeting a predetermined threshold. The threshold can be set at some level below the maximum leak level along the drive route. For example, with respect to curve 1404, a threshold 1414 is set 6 dB below a maximum leak level point 1415. Thus, all measured Doppler shift points (curve 1403) associated with leak levels (curve 1404) equal to or greater than threshold 1414 will be selected and used in the derivative equation to create derivative function curve 1409. This condition usually exists near the leak or point where zero Doppler shift occurs (e.g., see point C in FIG. 1). The measured Doppler shift points meeting this condition fall within a zone 1416. In curve 1403, three Doppler shift points meet the condition and fall within zone 1416. This is a simplified example. Of course, in most drive route tests, a larger sample of points will meet the threshold condition and fall within zone 1416. The points where the leak levels are at or near the maximum level can be used to mark a location where the zero measured Doppler shift value (FØ) occurs. It should be noted that threshold 1414 is preferably only used to select measured Doppler shift values for estimating the zero Doppler shift; however, measured Doppler shift values not meeting threshold 1414 may still be considered in computing actual Doppler shifts values for use in locating the leak (e.g., by triangulation).

By combining the above-described static and dynamic algorithms/methods, a good estimate can be obtained for FØ, a zero Doppler shift point (along drive route) where FØ occurs, and the actual Doppler shift values at each drive-route point. And, based on the estimated actual Doppler shift values, the locations of the leaks can be pinpointed using, e.g., a triangulation algorithm or some other suitable location algorithm.

Figure 15:
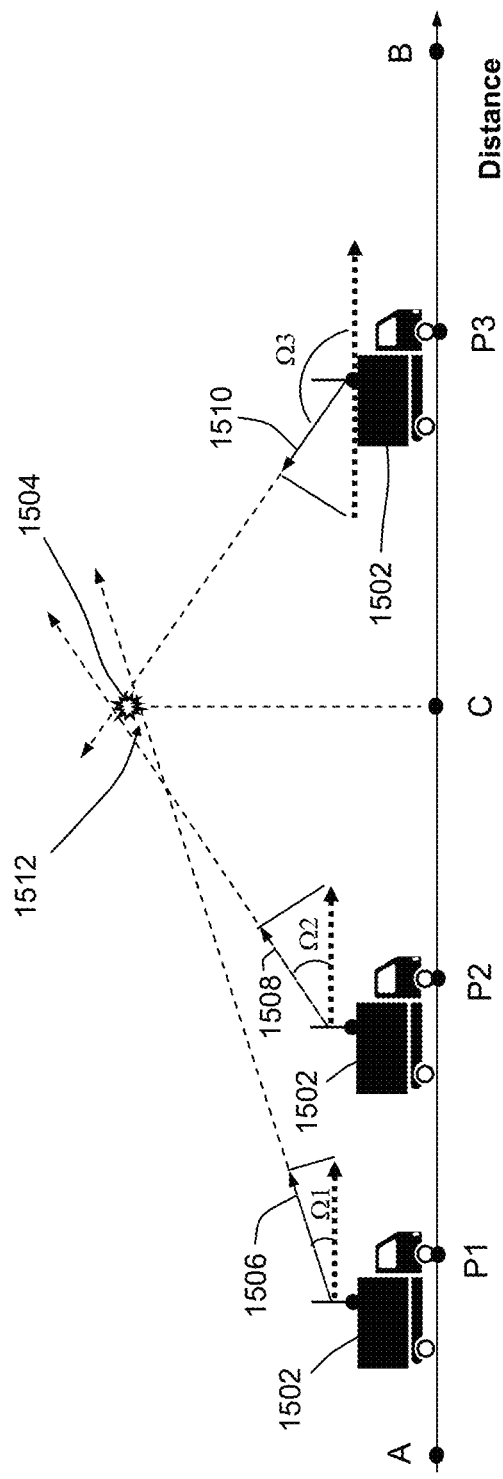
FIG. 15 is a schematic diagram illustrating more explicitly the Doppler method of locating a leak in an HFC network.

Referring to now to FIGS. 1 and 15, a brief description is given of the Doppler method using triangulation. Recall from FIG. 1, that vector 106 has a projection or bearing vector 108. The direction of vector 108 (established by angle Ω) is the estimated direction from drive-route point X to leak 104. This direction (or angle Ω) is determined based on: (i) the speed of truck 102; (ii) the distance from point X (position of truck 102) to zero Doppler shift point C (determined using one or both above-mentioned algorithms); and (iii) an actual Doppler shift value at point X (FAx) (determined using above-mentioned algorithms). The angle Q can be determined by the equation:

$$\Omega = \cos^{-1}(FAx/\text{hypothetical Doppler shift value at point } X) \quad (4)$$

where the hypothetical Doppler shift value at point X (FHx) is calculated or obtained from theoretical tables or curves, such as in graph 110 of FIG. 1. From the speed of truck 102 and the distance between point X and zero Doppler shift point C, FHx is obtained from graph 110 (i.e., FHx is considered the magnitude of vector 106). Thus, the inverse cosine ($\cos^{-1}$) of FAx/FHx=$\Omega$. Angle $\Omega$ provides the direction of vector 108, which is the estimated direction to leak 104 from point X. In the basic Doppler method employing triangulation, this process is repeated a number of times (e.g., 2 or more) at different points along a common path (e.g., the drive route). The resulting vectors are extended until they all intersect or nearly intersect, thus providing an estimate of a signal source's location (the estimated location being at the intersection or center of gravity of the nearly intersecting vectors). In one embodiment of the present invention, this Doppler/triangulation method is used to locate leaks in an HFC network (see FIG. 15).

In FIG. 15, a truck 1502 travels along a drive route through a geographic area covered by an HFC network containing a leak 1504. At a number of drive-route points, including points P1, P2 and P3, measurements are taken or determined such as truck speed, geographic coordinates, measured Doppler shift, leak level, etc. These measurements include the detection of a leakage signal emitted from leak 1504. The measurements were processed as previously described to yield actual Doppler shift values at points P1, P2 and P3 and to pinpoint zero Doppler shift point C. Based on this information, and on the truck speeds at points P1, P2 and P3 and the hypothetical Doppler shift values at points P1, P2 and P3, angles $\Omega 1$, $\Omega 2$ & $\Omega 3$ and bearing vectors 1506, 1508 & 1510 are determined using equation (4) above. In accordance with the Doppler method employing triangulation, vectors 1506, 1508 and 1510 are extended until they intersect each other at a single point or at an intersection zone 1512. Intersection zone 1512 provides an area of estimated location for leak 1504. Of course, the more drive-route points (Pm) and vectors employed, the more accurate the estimate of the location. Note that, in the preferred embodiment, the specific positions of vectors 1506, 1508 and 1510 are defined by the geographic coordinates recorded for each point P1, P2 and P3; and, the coordinates of each point are preferably recorded at the midpoint of the one-second time interval associated with the point.

As previously noted, one problem with the Doppler method is the potential for an ambiguity in the estimated location. For example, in the case of a truck traveling along a road relative to a signal source, the estimated location of the signal source may be indicated for either side of the road. In applying the Doppler method to an HFC network, there is an opportunity to overcome the ambiguity problem. An aspect of the present invention, which optionally may be employed in some embodiments (e.g., at central server 105), is to use an electronic network map to resolve any ambiguities and simplify calculations for estimating leak location (i.e., eliminating most of the calculations and steps associated with triangulation). This optional aspect of the invention ("map embodiment") uses the estimated point along the drive route where the Doppler shift equals zero and where the Doppler shift changes from positive to negative or vice versa. For example, in FIG. 1, once point C is estimated, an electronic network map can be used to locate leak 104. The layout of modern HFC networks is usually well-documented using electronic maps. Such maps are very accurate and GIS compatible (i.e., location of each device in network is given by actual GPS coordinates). Also, electronic maps are already integrated and operating in commercially available leakage servers, e.g., the QAM Snare® Leak Server (www.arcomdigital.com). Lastly, statistics of leak data in a number of systems shows that most leaks at LTE frequencies are associated with the trunk line cable (main branch of HFC network), and the locations of network devices in the trunk line are usually accurately identified in electronic network maps.

Figure 16:
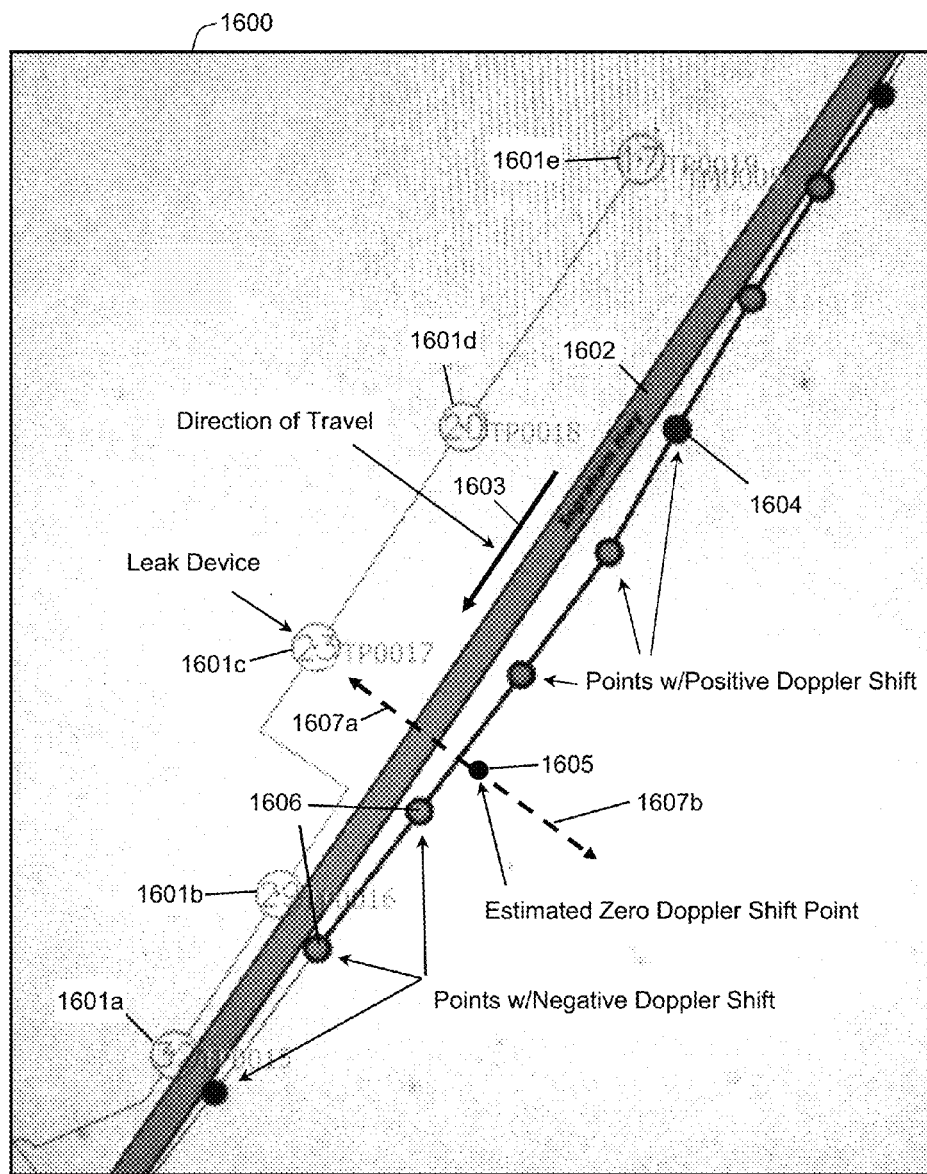
FIG. 16 is a depiction of an electronic map of an HFC network, illustrating an alternative method of locating a leak in the HFC network, once the zero Doppler shift point has been estimated.

The use of electronic network maps in the present invention is further understood by referring to FIG. 16. An electronic network map 1600 displays the position and identity of a plurality of network devices 1601a, 1601b, 1601c, 1601d, and 1601e in an HFC network. In this example, device 1601c contains a leak that emits a leakage signal. A truck equipped with a leakage detector (not shown in FIG. 16) traveled over drive routes throughout the HFC network, including the area displayed on map 1600. The truck traveled over a road 1602 and passed by network devices 1601a-1601e going in a direction 1603. While traveling through the HFC network, the truck detected leakage signals, determined leakage signal levels, measured Doppler shift, and recorded geographical coordinates and truck speed, at a number of drive-route points. In this map embodiment, the measurements were taken in accordance with, for example, the embodiment described with respect to FIGS. 1-10. As discussed, the measurements were sent in reports to central server 105, where they were processed to determine, among other things, the estimated actual Doppler shift values at each drive-route point and the zero Doppler shift points. The data was processed at central server 105 in accordance with, e.g., the estimation algorithms described with respect to FIGS. 11-14.

Electronic map 1600 displays the positions of the drive-route points and indicates for each point whether the actual Doppler shift value (FAm) is positive or negative. The positive/negative indication could be accomplished by color-coding the drive-route points (e.g., red for negative, blue for positive, and yellow for zero Doppler shift). The actual Doppler shift values at the drive-route points may also be displayed or at least associated with the points in a map database. As displayed on map 1600, there are a number of drive-route points 1604 and 1606 along road 1602. Points 1604 have positive actual Doppler shift values and points 1606 have negative actual Doppler shift values. Map 1600 also displays an estimated point 1605 where the Doppler shift is zero (determined at server 105, e.g., by employing the dynamic algorithm). Zero Doppler point 1605 is estimated to be the moment when the truck is closest to a leak (unknown position) and the truck's direction 1603 is perpendicular to the leak. In accordance with the map embodiment, the position of the leak is estimated by projecting a line 1607a from point 1605 perpendicular to direction 1603 (or to road 1602). Another line 1607b may also be projected from point 1605 in a direction opposite of the projection of line 1607a (FIG. 16). If line 1607a or line 1607b points to a network device or approximately points to a network device (e.g., if a network device is located a minimal distance from the projected line), then that network device is considered the probable location of the leak. In general, the leak is considered to be the network device to which either line 1607a, 1607b is most closely directed. In FIG. 16, line 1607a points to device 1601c and extends only a short distance before actually contacting device 1601c, and line 1607b does not point to or contact any device. Thus, it is determined that device 1601c is the probable source of the leak and the pre-recorded location of device 1601c is considered the estimated location of the leak. Any ambiguity as to which side of road 1602 the leak is on is avoided by knowing the position of the network device to which projected line 1607a is most closely directed.

It is noted that map 1600 is shown in FIG. 16 for the purpose of explaining the map embodiment. The use of an actual visual map to locate leak device 1601c is not required. The term "map" herein includes, but is not limited to, an actually displayed electronic network map or a database of equivalent information. In one embodiment, a map (which may or not be interactive) may be presented to display the above-mentioned network devices and Doppler information, and, in such case, leak location may be performed manually via a touch screen, pointer device, or by some other means. However, in another embodiment, a map may not be presented, and, in such case, leak location may be automatically determined by simply using the pre-recorded positions of the network devices and positions of the Doppler shift points. In the latter case, such information may be stored in a database typically used to support an electronic HFC network map.

As indicated, the map embodiment can result in a reduction and simplification of "location" calculations in server 105, as compared to brute-force triangulation. This can be an advantage in achieving real- or near real-time operation and in handling a large number of leakage detectors working simultaneously in the field. The reduction and simplification of calculations is demonstrated by the following example, considering, first, calculations using triangulation:

1. measure Doppler shift relative to nominal frequency;
2. estimate actual Doppler shift at each drive-route point;
3. estimate point of actual zero Doppler shift;
4. calculate direction to leak at each drive-route point, using actual Doppler shift;
5. calculate cross points of vectors for all directions;
6. calculate zone of cross points; and
7. calculate center of gravity in zone as estimation of leak location.

Now consider the calculations of the map embodiment of the present invention:

1. measure Doppler shift relative to nominal frequency;
2. estimate actual zero Doppler shift;
3. estimate point of actual zero Doppler shift;
4. calculate one or two directions (perpendicular line) from zero Doppler point to leak; and
5. determine nearest network device that perpendicular line is pointing or extending to.

Figure 17A:
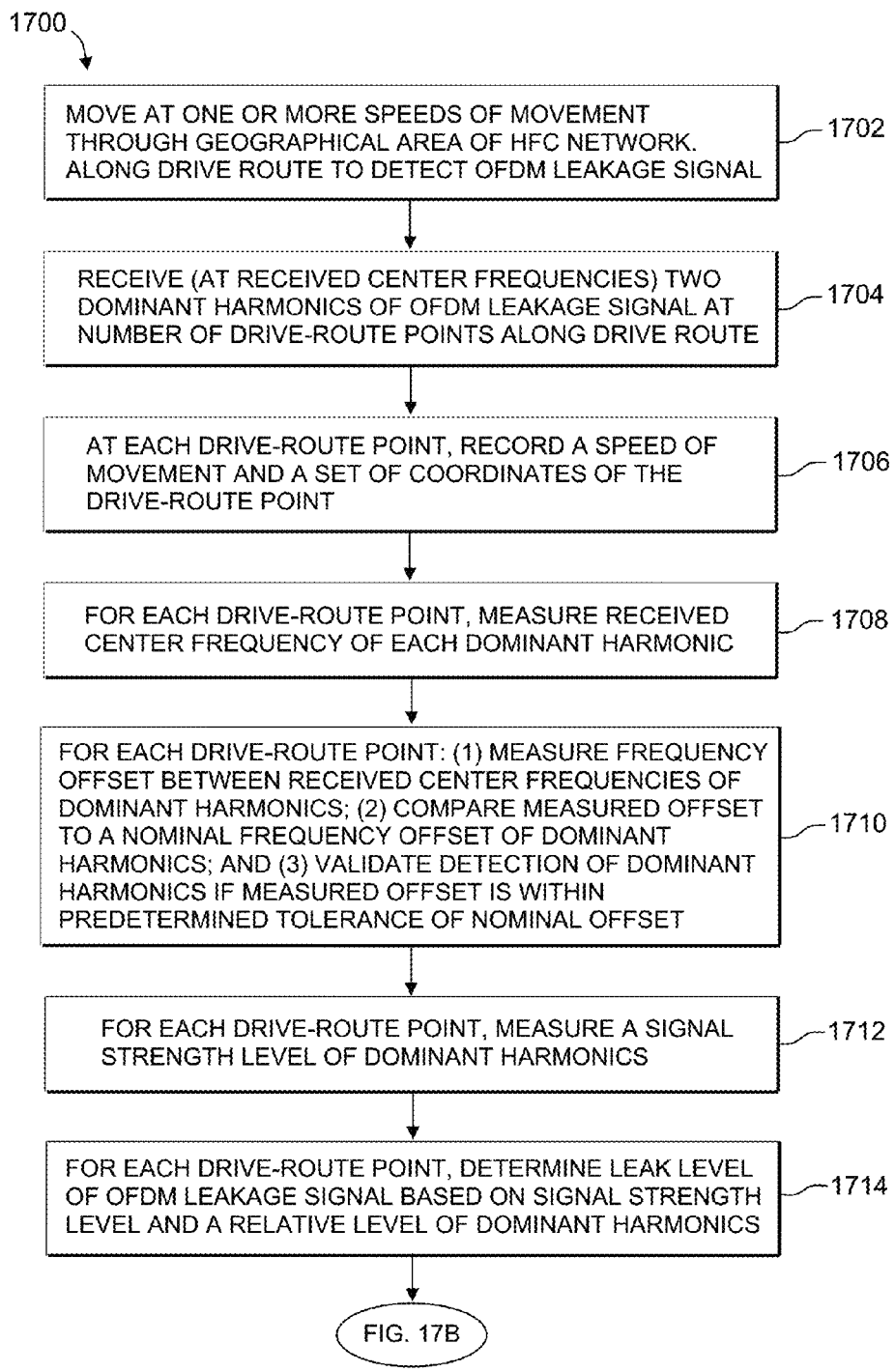
FIGS. 17A & 17B illustrate a flow diagram outlining a preferred method of using Doppler shift to locate a leak in an HFC network, in accordance with the present invention.
Figure 17B:
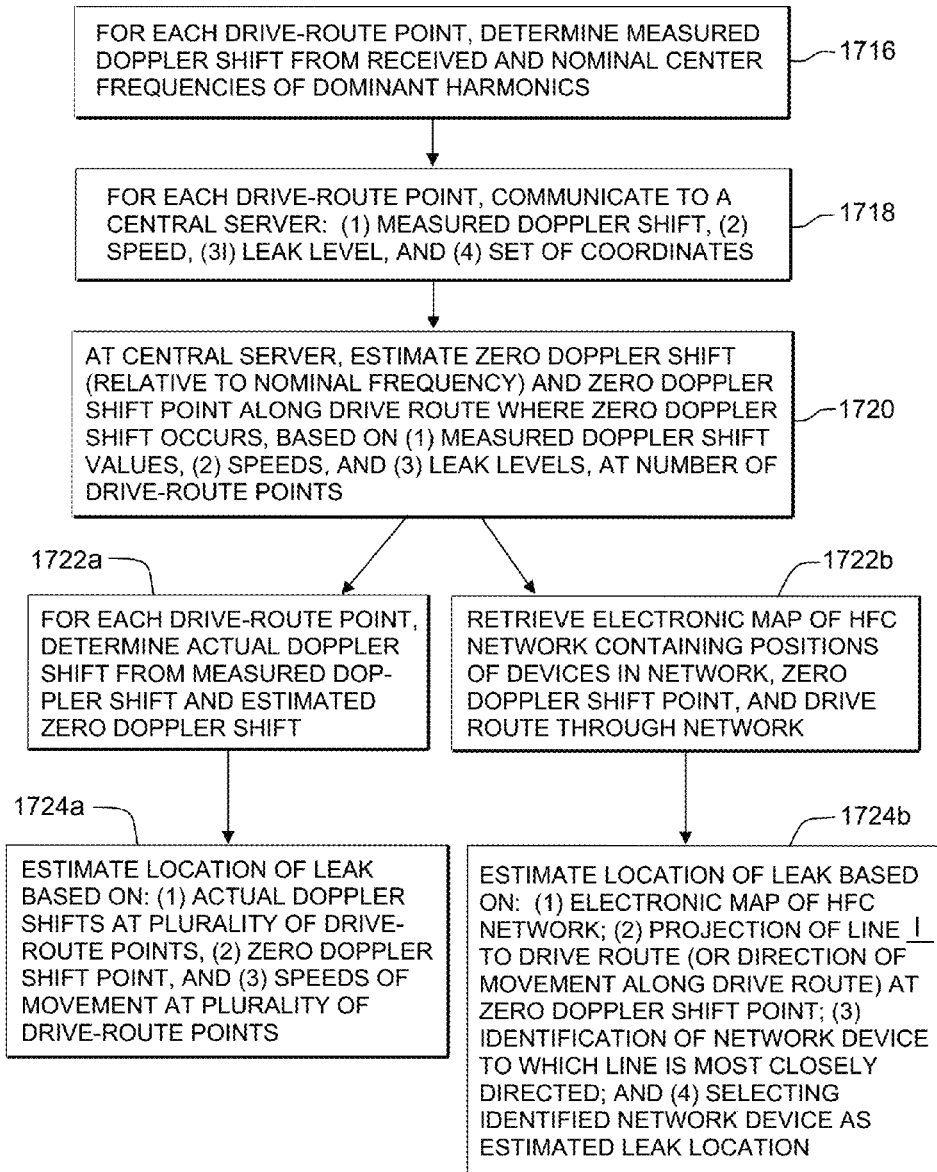

To summarize the preferred embodiments of the present invention, attention is now directed to FIGS. 17A and 17B. A method 1700 of locating a leak of an OFDM signal from an HFC network is presented in a number of steps. The HFC network extends over a geographic area, and the OFDM signal emitted from the leak becomes a leakage signal. The OFDM signal (or leakage signal) includes a number of continuous pilot subcarriers, each of which contains at least one dominant harmonic. Two of these dominant harmonics (one each from two different continuous pilot subcarriers) are selected for detection of the leakage signal. The two selected harmonics are each defined by a nominal center frequency, a relative level RLharm, and a nominal frequency offset FOharm (these terms were defined above). In a first step 1702, a leakage detector is moved through the geographical area of the HFC network, along a drive route, to detect the leakage signal. The movement along the drive route may be at one or more speeds of movement. In a second step 1704, the two dominant harmonics of the leakage signal are received at a number of drive-route points along the drive route. Each dominant harmonic is received at a respective received center frequency. In a third step 1706, at each drive-route point, a speed of movement and a set of coordinates of the drive-route point are recorded. In a fourth step 1708, at each drive-route point, the received center frequency of each dominant harmonic is measured. In a fifth step 1710, at each drive-route point: (1) the frequency offset between the received center frequencies of the dominant harmonics is measured; (2) the measured frequency offset is compared to the nominal frequency offset of the dominant harmonics; and (3) the detection of the two dominant harmonics is validated if the measured frequency offset is within a predetermined tolerance (a few Hz) of the nominal frequency offset. In a sixth step 1712, at each drive-route point, a field strength level of each dominant harmonic is measured. In a seventh step 1714, for each drive-route point, a leak level of the leakage signal is determined based on the field strength level and the relative level RLharm of one or both of the dominant harmonics.

The description of method 1700 continues with reference to FIG. 17B. In an eighth step 1716, for each drive-route point, a measured Doppler shift value is determined from the received and nominal center frequencies of the two dominant harmonics. In a ninth step 1718, for each drive-route point, the following data are communicated to a central server: (1) the measured Doppler shift value, (2) the speed of movement, (3) the leak level of the leakage signal, and (4) the set of coordinates. In a tenth step 1720, at the central server, a zero Doppler shift value F0 (relative to nominal frequency) and a zero Doppler shift point along the drive route where F0 occurs, are estimated based on (1) the measured Doppler shift values, (2) the speeds of movement, and (3) the leak levels of the leakage signal, at the number of drive-route points. Method 1700 follows one of two paths after step 1720, depending on the approach employed for estimating the location of the leak. In a pair of steps 1722a and 1724a, the leak is located by the triangulation embodiment. In a pair of steps 1722b and 1724b, the leak is located by the electronic map embodiment. Both embodiments are preferably carried out at the central server, but may also be implemented in the leakage detector (e.g., in CPU 713). Method 1700 may perform both paths, where the result of one will confirm the result of the other.

In step 1722a, for each drive-route point, an actual Doppler shift value is determined from the measured Doppler shift value and the estimated F0. In step 1724a, the location of the leak is determined based on: (1) the actual Doppler shift values at a plurality of the drive-route points; (2) the zero Doppler shift point; and (3) the speeds of movement at the plurality of the drive-route points. This is the triangulation approach. In step 1722b, an electronic map of the HFC network (and/or its associated database) is retrieved. The map (and database) contains identities and positions of devices in the network, the zero Doppler shift point, and the drive route through an area of the HFC network. In step 1724b, the location of the leak is determined based on: (1) the electronic map (and/or database) of the HFC network; (2) a projection of a line perpendicular to the drive route (or direction of movement along drive route) at the zero Doppler shift point; (3) identification of the network device to which the line is most closely directed; and (4) selecting the identified network device as the estimated location of the leak. In the case where both paths for locating the leak are performed, the location of the leak estimated by the triangulation embodiment is compared with the location estimated by the electronic map environment.

As used in this description and in the claims, the term "received frequency" or "received frequencies" means the actual frequency or frequencies of the leakage signal received by a receiver or leakage detector (e.g., detector 700), including any filtered or down-converted form of the leakage signal or part of the leakage signal. The term may refer to any signal component of the leakage signal, such as a continuous pilot subcarrier or a harmonic of the pilot. For example, the frequency measured in block 712 (FIG. 7) of a dominant harmonic of a leakage signal is a received frequency; block 712 measures the received frequency of the harmonic at the second IF.

The various functions of the present invention, as described above, may be implemented in hardware, firmware, software, or a combination of these. For example, with respect to hardware, these functions may be implemented in an application specific integrated circuit (ASIC), digital signal process or (DSP), field programmable gate array (FPGA), micro-controller, microprocessor, programmable logic device, general purpose computer, special purpose computer, other electronic device, or a combination of these devices (hereinafter "processor"). If the various functions are implemented in firmware, software, or other computer-executable instructions, then they may be stored on any suitable computer-readable media. Computer-executable instructions may cause a processor to perform the aforementioned functions of the present invention. Computer-executable instructions include data structures, objects, programs, routines, or other program modules accessible and executable by a processor. The computer-readable media may be any available media accessible by a processor. Embodiments of the present invention may include one or more computer-readable media. Generally, computer-readable media include, but are not limited to, random-access memory ("RAM), read-only memory ("ROM), programmable read-only memory ("PROM), erasable programmable read-only memory ("EPROM"), electrically erasable programmable read-only memory ("EEPROM"), compact disk read-only memory ("CD-ROM), flash memory or any other device or component that is capable of providing data or executable instructions accessible by a processor. Certain embodiments recited in the claims may be limited to the use of tangible, non-transitory computer-readable media, and the phrases "tangible computer-readable medium" and "non-transitory computer-readable medium" (or plural variations) used herein are intended to exclude transitory propagating signals per se.

While the preferred embodiments of the invention have been particularly described in the specification and illustrated in the drawing, it should be understood that the invention is not so limited. Many modifications, equivalents and adaptations of the invention will become apparent to those skilled in the art without departing from the spirit and scope of the invention, as defined in the appended claims.

What is claimed is:

1. A method of locating a leak in a Hybrid Fiber-Coax (HFC) network extending over a geographic area, the leak emitting a leakage signal over-the-air, the leakage signal including a signal component defined by a nominal frequency and having an actual frequency that deviates from the nominal frequency by a frequency error, said method comprising the steps of:
    (a) moving through the geographic area of the HFC network, along a drive route;
    (b) at each of a plurality of drive-route points along the drive route, receiving the signal component of the leakage signal at a receive frequency;
    (c) for each drive-route point, measuring the receive frequency of the signal component;
    (d) for each drive-route point, determining a measured Doppler shift value from the receive frequency and the nominal frequency of the signal component;
    (e) determining a value of the frequency error associated with the signal component, and using the value of the frequency error as an estimate of a zero measured Doppler shift value;
    (f) estimating a zero Doppler shift point where the zero measured Doppler shift value occurs, based on at least the measured Doppler shift values determined in step (d); and
    (g) estimating a location of the leak based on at least the estimated zero Doppler shift point.

2. The method of claim 1, wherein the signal component of the leakage signal is a pilot subcarrier.

3. The method of claim 1, wherein the leakage signal includes a pilot subcarrier having an harmonic, and wherein the signal component of the leakage signal is the harmonic of the pilot subcarrier.

4. The method of claim 1, wherein the leakage signal is an OFDM signal containing a continuous pilot subcarrier having a dominant harmonic, and wherein the signal component is the dominant harmonic of the continuous pilot subcarrier.

5. The method of claim 1, further comprising the steps of:
    (h) repeating steps (b), (c) and (d) a plurality of times to produce a plurality of measured Doppler shift values for each drive-route point; and
    (i) for each drive-route point, averaging the plurality of measured Doppler shift values to produce an averaged Doppler shift value; and wherein
    step (f) includes estimating the zero Doppler shift point based on at least the averaged Doppler shift values produced from steps (h) and (i).

6. The method of claim 1, further comprising the step of recording a speed of movement at each of the drive-route points along the drive route; and wherein step (e) includes—
    (i) for each drive-route point, determining a Doppler shift range of potential zero Doppler shift values based on the measured Doppler shift value determined for the drive-route point and based on the speed of movement recorded for the drive-route point, to produce a plurality of Doppler shift ranges for the plurality of drive-route points,
    (ii) determining a distribution from the values of the plurality of Doppler shift ranges, the distribution being defined by a set of Doppler shift frequencies and, for each Doppler shift frequency of the set, a totaled number of the Doppler shift ranges that contain the Doppler shift frequency, and
    (iii) selecting from the distribution a Doppler shift frequency of the set having substantially the highest totaled number,
    whereby the selected Doppler shift frequency is taken as an estimate of the zero measured Doppler shift value.

7. The method of claim 1, wherein step (f) includes—
    (i) determining a plurality of derivative values from the measured Doppler shift values obtained in step (d), each derivative value being a function of a change in measured Doppler shift over an incremental distance along the drive route, (ii) identifying a maximum value from the plurality of derivative values, the maximum value being associated with a maximum value point along the drive route, and
(iii) estimating the zero Doppler shift point from the maximum value point.

8. The method of claim 7, wherein step (e) includes—
(i) determining an estimated measured Doppler shift value associated with the maximum value point, based on a function of the measured Doppler shift values obtained in step (d) and of the drive-route points associated with the measured Doppler shift values, and
(ii) selecting the estimated measured Doppler shift value as the value of the frequency error of the signal component and as an estimate of the zero measured Doppler shift value.

9. The method of claim 1, wherein step (f) includes—
(i) obtaining a level associated with the leakage signal at each of the plurality of drive-route points, to produce a plurality of levels, the plurality of levels including a maximum level and a number of threshold levels within a predefined threshold of the maximum level,
(ii) selecting from the measured Doppler shift values determined in step (d) those values associated with the drive-route points at which the maximum level and the number of threshold levels were obtained,
(iii) determining a set of derivative values from the selected measured Doppler shift values, each derivative value being a function of a change in measured Doppler shift over an incremental distance along the drive route,
(iv) identifying a maximum value from the set of derivative values, the maximum value being associated with a maximum value point along the drive route, and
(v) estimating the zero Doppler shift point from the maximum value point.

10. The method of claim 9, wherein step (e) includes—
(i) determining an estimated measured Doppler shift value associated with the maximum value point, based on a function of the selected measured Doppler shift values and of the drive-route points associated with the selected measured Doppler shift values, and
(ii) selecting the estimated measured Doppler shift value as the value of the frequency error of the signal component and as an estimate of the zero measured Doppler shift value.

11. The method of claim 1, wherein step (e) includes—
(i) while stationary, receiving the signal component of the leakage signal at a stationary frequency, and
(ii) measuring the stationary frequency of the signal component to produce an estimate of the actual frequency of the signal component, and
(iii) determining a value of the frequency error from the estimated actual frequency and the nominal frequency of the signal component.

12. The method of claim 1, wherein step (f) includes estimating the zero Doppler shift point based on the measured Doppler shift values determined in step (d) and the zero measured Doppler shift value estimated in step (e).

13. The method of claim 1, further comprising the steps of:
(h) recording a speed of movement at each drive-route point; and
(i) for each drive-route point, determining an actual Doppler shift value from the measured Doppler shift value of the drive-route point and from the estimated zero measured Doppler shift value, and
wherein step (g) includes estimating the location of the leak based on the estimated zero Doppler shift point, the speeds of movement at the drive-route points, and the actual Doppler shift values at the drive-route points.

14. The method of claim 13, wherein the plurality of drive-route points are defined by a plurality of drive-route positions, respectively, relative to the zero Doppler shift point, and
wherein step (g) is performed in accordance with a triangulation procedure using a plurality of hypothetical Doppler shift values,
the plurality of hypothetical Doppler shift values being a function of the speeds of movement at the plurality of drive-route points, respectively, and of the plurality of drive-route positions, respectively,
the triangulation procedure including—
(i) determining a plurality of bearing vectors at the plurality of drive-route points, respectively, based on the plurality of hypothetical Doppler shift values and on the actual Doppler shift values associated with the plurality of drive-route points,
(ii) identifying an intersection point or an intersection zone from an intersection of the plurality of bearing vectors, and
(iii) estimating the location of the leak to be substantially at the intersection point or within the intersection zone.

15. The method of claim 14, wherein the triangulation procedure further includes:
(iv) retrieving an electronic map of the HFC network extending over the geographic area, the electronic map containing the drive route, a plurality of network devices of the network located substantially along the drive route, and the estimated zero Doppler shift point;
(v) projecting a line substantially perpendicular to the drive route at the estimated zero Doppler shift point;
(vi) identifying a first network device of the plurality of network devices to which the line is most closely directed;
(vii) selecting the first network device as an estimate of the location of the leak; and
(viii) comparing the location of the leak estimated in step (iii) of the triangulation procedure with the location of the leak estimated in step (vii) of the triangulation procedure.

16. The method of claim 1, wherein step (g) includes
(i) retrieving an electronic map of the HFC network extending over the geographic area, the electronic map containing the drive route, a plurality of network devices of the network located substantially along the drive route, and the estimated zero Doppler shift point;
(ii) projecting a line substantially perpendicular to the drive route at the estimated zero Doppler shift point;
(iii) identifying a first network device of the plurality of network devices to which the line is most closely directed; and
(iv) selecting the first network device as an estimate of the location of the leak.

17. The method of claim 1, wherein the HFC network includes a plurality of network devices defined by a plurality of network device locations, respectively, within the geographic area, and wherein step (g) includes the following sub-steps
(i) determining which network device location is closest to the estimated zero Doppler shift point, and
(ii) selecting the network device associated with the location determined in sub-step (i), as the estimated location of the leak.

18. A method of locating a leak in a Hybrid Fiber-Coax (HFC) network extending over a geographic area, the leak emitting a leakage signal over-the-air, the leakage signal including first and second pilot signals having first and second harmonics, respectively, the first harmonic being defined by a first nominal frequency and having a first actual frequency that deviates from the first nominal frequency by a frequency error, the second harmonic being defined by a second nominal frequency and having a second actual frequency that deviates from the second nominal frequency by about the frequency error, said method comprising the steps of:

(a) moving through the geographic area of the HFC network, along a drive route;

(b) at each of a plurality of drive-route points along the drive route, receiving the first and the second harmonics at first and second receive frequencies, respectively;

(c) for each drive-route point, measuring the first and the second receive frequencies of the first and the second harmonics;

(d) for each drive-route point, determining a first measured Doppler shift value from the first receive frequency and the first nominal frequency of the first harmonic, and determining a second measured Doppler shift value from the second receive frequency and the second nominal frequency of the second harmonic;

(e) determining a value of the frequency error and using the value of the frequency error as an estimate of a zero measured Doppler shift value;

(f) estimating a zero Doppler shift point where the zero Doppler shift value occurs, based on at least the first and the second measured Doppler shift values determined for the plurality of drive-route points; and (g) estimating a location of the leak based on at least the estimated zero Doppler shift point.

19. The method of claim 18, further comprising the steps of:

(h) repeating steps (b), (c) and (d) a plurality of times to produce a plurality of first and second measured Doppler shift values for each drive-route point; and (i) for each drive-route point, averaging the plurality of first and second measured Doppler shift values to produce an averaged Doppler shift value; and wherein step (f) includes estimating the zero Doppler shift point based on at least the averaged Doppler shift values produced from steps (h) and (i).

20. The method of claim 19, further comprising the steps of:

(j) recording a speed of movement at each drive-route point; and (k) for each drive-route point, determining an actual Doppler shift value from the averaged Doppler shift value of the drive-route point and from the estimated zero measured Doppler shift value, and wherein step (g) includes estimating the location of the leak based on the estimated zero Doppler shift point, the speeds of movement at the drive-route points, and the actual Doppler shift values at the drive-route points.

21. The method of claim 20, wherein the plurality of drive-route points are defined by a plurality of drive-route positions, respectively, relative to the zero Doppler shift point, and wherein step (g) is performed in accordance with a triangulation procedure using a plurality of hypothetical Doppler shift values, the plurality of hypothetical Doppler shift values being a function of the speeds of movement at the plurality of drive-route points, respectively, and of the plurality of drive-route positions, respectively, the triangulation procedure including—

(i) determining a plurality of bearing vectors at the plurality of drive-route points, respectively, based on the plurality of hypothetical Doppler shift values and on the actual Doppler shift values associated with the plurality of drive-route points, (ii) identifying an intersection point or an intersection zone from an intersection of the plurality of bearing vectors, and (iii) estimating the location of the leak to be substantially at the intersection point or within the intersection zone.

22. The method of claim 21, wherein the triangulation procedure further includes:

(iv) retrieving an electronic map of the HFC network extending over the geographic area, the electronic map containing the drive route, a plurality of network devices of the network located substantially along the drive route, and the estimated zero Doppler shift point;

(v) projecting a line substantially perpendicular to the drive route at the estimated zero Doppler shift point;

(vi) identifying a first network device of the plurality of network devices to which the line is most closely directed;

(vii) selecting the first network device as an estimate of the location of the leak; and (viii) comparing the location of the leak estimated in step (iii) of the triangulation procedure with the location of the leak estimated in step (vii) of the triangulation procedure.

23. The method of claim 18, wherein step (g) includes (i) retrieving an electronic map of the HFC network extending over the geographic area, the electronic map containing the drive route, a plurality of network devices of the network located substantially along the drive route, and the estimated zero Doppler shift point;

(ii) projecting a line substantially perpendicular to the drive route at the estimated zero Doppler shift point;

(iii) identifying a first network device of the plurality of network devices to which the line is most closely directed; and (iv) selecting the first network device as an estimate of the location of the leak.

24. The method of claim 18, wherein the first and the second harmonics are further defined by a nominal frequency offset between the first and the second nominal frequencies, said method further comprising the step of:

(h) for each drive-route point, (i) measuring a frequency offset between the first and the second receive frequencies of the first and the second harmonics, (ii) comparing the measured frequency offset to the nominal frequency offset, and (iii) validating the receipt of the first and the second harmonics if the measured frequency offset is within a predetermined tolerance of the nominal frequency offset.

25. The method of claim 18, further comprising the steps of:

(h) for each drive-route point, measuring a first signal strength level of the first harmonic; and (i) for each drive-route point, determining a leak level of the leakage signal based on the first signal strength level.

26. The method of claim 18, further comprising the steps of:

(h) for each drive-route point, measuring first and second signal strength levels of the first and the second harmonics, respectively; and (i) for each drive-route point, determining a leak level of the leakage signal based on the first and the second signal strength levels.

27. The method of claim 18, wherein the first harmonic is further defined by a first relative level which relates signal strength level of the first harmonic to the total energy of the first pilot signal, said method further comprising the steps of:
(h) for each drive-route point, measuring a first signal strength level of the first harmonic; and
(i) for each drive-route point, determining a leak level of the leakage signal based on the first signal strength level and the first relative level.

28. The method of claim 18, wherein the first and the second harmonics are further defined by first and second relative levels, respectively, said method further comprising the steps of:
(h) for each drive-route point, measuring a first signal strength level of the first harmonic and a second signal strength level of the second harmonic; and
(i) for each drive-route point, determining a leak level of the leakage signal based on the first and the second signal strength levels and on the first and the second relative levels.

29. The method of claim 28, wherein the leak level of the leakage signal is determined in step (i) by
(1) determining a first leak level from the first signal strength level and the first relative level,
(2) determining a second leak level from the second signal strength level and the second relative level, and
(3) averaging the first leak level and the second leak level to determine the leak level of the leakage signal.

30. The method of claim 18, further comprising the step of
(h) for each drive-route point, averaging the first and the second measured Doppler shift values to produce an averaged Doppler shift value, and wherein
step (f) includes estimating the zero Doppler shift point based on at least the averaged Doppler shift values determined for the plurality of drive-route points.

31. The method of claim 30, further comprising the step of recording a speed of movement at each of the drive-route points along the drive route; and wherein step (e) includes—
(i) for each drive-route point, determining a Doppler shift range of potential zero Doppler shift values based on the averaged Doppler shift value produced for the drive-route point and based on the speed of movement recorded for the drive-route point, to produce a plurality of Doppler shift ranges for the plurality of drive-route points,
(ii) determining a distribution from the values of the plurality of Doppler shift ranges, the distribution being defined by a set of Doppler shift frequencies and, for each Doppler shift frequency of the set, a totaled number of the Doppler shift ranges that contain the Doppler shift frequency, and
(iii) selecting from the distribution a Doppler shift frequency of the set having substantially the highest totaled number,
whereby the selected Doppler shift frequency is taken as an estimate of the zero measured Doppler shift value.

32. The method of claim 30, wherein step (f) includes—
(i) determining a plurality of derivative values from the averaged Doppler shift values produced in step (h), each derivative value being a function of a change in measured Doppler shift over an incremental distance along the drive route,
(ii) identifying a maximum value from the plurality of derivative values, the maximum value being associated with a maximum value point along the drive route, and
(iii) estimating the zero Doppler shift point from the maximum value point.

33. The method of claim 32, wherein step (e) includes—
(i) determining an estimated measured Doppler shift value associated with the maximum value point, based on a function of the averaged Doppler shift values and of the drive-route points associated with the averaged Doppler shift values, and
(ii) selecting the estimated measured Doppler shift value as the value of the frequency error of the signal component and as an estimate of the zero measured Doppler shift value.

34. The method of claim 30, wherein step (f) includes—
(i) obtaining a level associated with the leakage signal at each of the plurality of drive-route points, to produce a plurality of levels, the plurality of levels including a maximum level and a number of threshold levels within a predefined threshold of the maximum level,
(ii) selecting from the averaged Doppler shift values produced in step (h) those values associated with the drive-route points at which the maximum level and the number of threshold levels were obtained,
(iii) determining a set of derivative values from the selected averaged Doppler shift values, each derivative value being a function of a change in measured Doppler shift over an incremental distance along the drive route,
(iv) identifying a maximum value from the set of derivative values, the maximum value being associated with a maximum value point along the drive route, and
(v) estimating the zero Doppler shift point from the maximum value point.

35. The method of claim 34, wherein step (e) includes—
(i) determining an estimated measured Doppler shift value associated with the maximum value point, based on a function of the selected averaged Doppler shift values and of the drive-route points associated with the selected averaged Doppler shift values, and
(ii) selecting the estimated measured Doppler shift value as the value of the frequency error of the signal component and as an estimate of the zero measured Doppler shift value.

36. The method of claim 34, wherein each derivative value is associated with a current drive-route point and a previous drive-route point, each derivative value being a function of a change in measured Doppler shift over a distance between the current drive-route point and the previous drive-route point.

37. The method of claim 18, wherein step (e) includes—
(i) while stationary, receiving the first and the second harmonics at first and second stationary frequencies, and
(ii) measuring the first and the second stationary frequencies to produce estimates of the first and the second actual frequencies of the first and second harmonics, and
(iii) determining a value of the frequency error from a first difference between the estimated first actual frequency and the first nominal frequency of the first harmonic, or from a second difference between the estimated second actual frequency and the second nominal frequency of the second harmonic, or from both the first and the second differences.

38. A method of locating a leak in a Hybrid Fiber-Coax (HFC) network extending over a geographic area, the leak emitting a leakage signal over-the-air, the leakage signal including first and second pilot signals having first and second harmonics, respectively, the first harmonic being defined by a first nominal frequency and having a first actual frequency that deviates from the first nominal frequency by a frequency error, the second harmonic being defined by a second nominal frequency and having a second actual frequency that deviates from the second nominal frequency by about the frequency error, said method comprising the steps of:

(a) moving through the geographic area of the HFC network, along a drive route, at one or more speeds of movement;

(b) recording a speed of movement at each of a plurality of drive-route points along the drive route;

(c) at each drive-route point, receiving the first and the second harmonics at first and second receive frequencies, respectively;

(d) for each drive-route point, measuring the first and the second receive frequencies of the first and the second harmonics;

(e) for each drive-route point, determining a measured Doppler shift value from (1) a first difference between the first receive frequency and the first nominal frequency of the first harmonic, or (2) the first difference and a second difference between the second receive frequency and the second nominal frequency of the second harmonic;

(f) for each drive-route point, repeating steps (c), (d) and (e) a plurality of times to produce a plurality of measured Doppler shift values for each drive-route point;

(g) for each drive-route point, averaging the plurality of measured Doppler shift values to produce an averaged Doppler shift value;

(h) determining a value of the frequency error and using the value of the frequency error as an estimate of a zero measured Doppler shift value;

(i) estimating a zero Doppler shift point where the zero measured Doppler shift value occurs, based on at least the averaged Doppler shift values of the plurality of drive-route points; and (j) estimating a location of the leak based on at least the estimated zero Doppler shift point.

39. The method of claim 38, further comprising the step of:

(k) for each drive-route point, determining an actual Doppler shift value from the averaged Doppler shift value and the estimated zero Doppler shift value; and wherein step (j) includes estimating the location of the leak based on (1) the actual Doppler shift values for the drive-route points, (2) the zero Doppler shift point, and (3) the speeds of movement at the plurality of the drive-route points.

\* \* \* \* \*